United States Patent
Hwang

(10) Patent No.: US 9,817,591 B2
(45) Date of Patent: Nov. 14, 2017

(54) STORAGE DEVICE AND STORAGE SYSTEM STORING DATA BASED ON RELIABILITY OF MEMORY AREA

(71) Applicant: SAMSUNG ELECTRONICS CO., LTD., Suwon-si, Gyeonggi-do (KR)

(72) Inventor: Jooyoung Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 29 days.

(21) Appl. No.: 14/962,899

(22) Filed: Dec. 8, 2015

(65) Prior Publication Data

US 2016/0179421 A1    Jun. 23, 2016

(30) Foreign Application Priority Data

Dec. 18, 2014    (KR) .......................... 10-2014-0183292

(51) Int. Cl.
*G06F 12/00* (2006.01)
*G06F 3/06* (2006.01)
*G11C 29/42* (2006.01)
*G06F 11/10* (2006.01)

(52) U.S. Cl.
CPC ............ *G06F 3/0619* (2013.01); *G06F 3/065* (2013.01); *G06F 3/0685* (2013.01); *G06F 11/1048* (2013.01); *G06F 2212/1036* (2013.01); *G11C 29/42* (2013.01)

(58) Field of Classification Search
CPC ...... G06F 3/0619; G06F 3/0685; G06F 3/065; G06F 11/1048; G06F 2212/1036; G11C 29/42

USPC .............. 714/47.1, 723; 711/170, 103, 162
See application file for complete search history.

(56) References Cited

U.S. PATENT DOCUMENTS

| | | | |
|---|---|---|---|
| 7,386,757 B2 | 6/2008 | Lindenstruth et al. | |
| 7,412,575 B2 | 8/2008 | Park et al. | |
| 7,646,636 B2 | 1/2010 | Kim | |
| 8,589,730 B2 | 11/2013 | Byom et al. | |
| 8,732,518 B2 | 5/2014 | Storer et al. | |
| 2005/0234847 A1 | 10/2005 | Damien et al. | |
| 2006/0107127 A1 | 5/2006 | Park et al. | |
| 2006/0133157 A1* | 6/2006 | Murin ................... | G06F 3/0626 365/189.16 |

(Continued)

FOREIGN PATENT DOCUMENTS

EP    1863182 A1    12/2007
JP    2005-302233 A    10/2005

(Continued)

*Primary Examiner* — Hong Kim
(74) *Attorney, Agent, or Firm* — Volentine & Whitt, PLLC

(57) ABSTRACT

A storage device communicating with a host includes a plurality of memory devices and a memory controller. Each of the memory devices includes at least one of a plurality of memory areas that have different storage reliability levels. The memory controller controls the memory devices such that data and required level data associated with a required reliability level of the data are stored in some or all of the memory areas. The data and the required level data are provided from the host. The data is stored in a memory area having a storage reliability level corresponding to the required reliability level from among the memory areas, according to a control of the memory controller.

20 Claims, 19 Drawing Sheets

(56) References Cited

U.S. PATENT DOCUMENTS

| | | | |
|---|---|---|---|
| 2008/0215911 A1* | 9/2008 | Chang | G06F 12/0246 |
| | | | 714/5.1 |
| 2012/0054541 A1 | 3/2012 | Byom et al. | |
| 2013/0055012 A1 | 2/2013 | Roh | |
| 2013/0103894 A1* | 4/2013 | Roohparvar | G06F 12/0246 |
| | | | 711/103 |
| 2013/0124914 A1 | 5/2013 | Liu et al. | |
| 2013/0185482 A1 | 7/2013 | Kim et al. | |
| 2015/0039815 A1* | 2/2015 | Klein | G06F 12/0246 |
| | | | 711/103 |
| 2015/0200688 A1* | 7/2015 | Pan | H03M 13/3927 |
| | | | 714/794 |
| 2016/0011815 A1* | 1/2016 | Klein | G06F 3/0644 |
| | | | 714/6.12 |

FOREIGN PATENT DOCUMENTS

| | | |
|---|---|---|
| JP | 2014-517952 A | 7/2014 |
| KR | 1020050100561 A | 10/2005 |
| KR | 1020060039771 A | 5/2006 |
| KR | 1020120021210 A | 3/2012 |
| KR | 1020120024906 A | 3/2012 |
| KR | 1020130023984 A | 3/2013 |
| KR | 1020130084988 A | 7/2013 |
| KR | 20140050738 A | 4/2014 |

* cited by examiner

FIG. 16
| Host data | 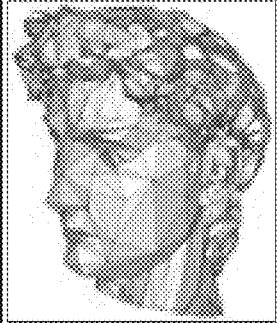 |  |  |
|---|---|---|---|
| | HD1 | HD2 | HD3 |
| Level | High | Middle | Low |
| Retention | Long(T3) | Middle(T2) | Short(T1) |
FIG. 17
| | T1 | T2 | T3 → Time |
|---|---|---|---|
| | 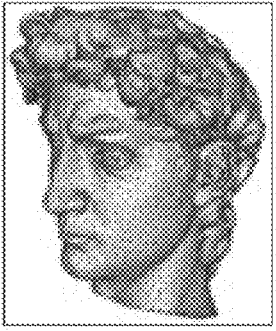 |  |  |
| | HD1, HD2 and HD3 are available | HD1 and HD2 are available | HD1 is available |
| | High quality | Relatively low quality | Low quality |

STORAGE DEVICE AND STORAGE SYSTEM STORING DATA BASED ON RELIABILITY OF MEMORY AREA

CROSS-REFERENCE TO RELATED APPLICATIONS

This US non-provisional patent application claims priority under 35 USC §119 to Korean Patent Application No. 10-2014-0183292, filed on Dec. 18, 2014, in the Korean Intellectual Property Office, the entire contents of which are incorporated herein by reference.

BACKGROUND

1. Technical Field

The present disclosure relates to storing data, and more particularly, to storage devices and storage systems for storing data.

2. Description of the Related Art

Recently, various kinds of information have been generated. Generated information is recorded by various methods, and the recorded information is searched or processed. For example, information is stored in the form of electronic data. Various types of storage devices have been manufactured and used to electrically store data. One or more storage devices may constitute a storage system. Some storage devices or storage systems store data permanently or semi-permanently.

The life of a storage device or a storage system is limited due to its repeated use. For example, a mechanical storage medium such as a hard disk drive (HDD) is physically damaged by a disk head due to repeated accesses. For another example, memory cells included in a storage medium employing a flash memory, such as a solid-state drive (SSD), are deteriorated with repeated program and erase operations.

As a storage device or a storage system is damaged, the life of the storage device or the storage system may come to an end. When the life of the storage device or the storage system comes to an end, the storage device or the storage system may not store data normally. The time period for using the storage device or the storage system needs to be extended, in order to reliably store data.

SUMMARY

The present disclosure provides configurations and schemes to extend time for using a storage device or a storage system. According to example embodiments of the present disclosure, data may be stored based on reliability of a memory area of a storage device or a storage system. A storage device or a storage system according to example embodiments of the present disclosure may receive a required reliability level of data or a required retention time of data from a host.

Embodiments of the disclosure provide a storage device configured to communicate with a host. The storage device may include a plurality of memory devices and a memory controller. Each of the plurality of memory devices may include at least one of a plurality of memory areas. The plurality of memory areas may have different storage reliability levels. The memory controller may control the plurality of memory devices such that data and required level data associated with a required reliability level of the data are stored in some or all of the plurality of memory areas. The data and the required level data may be provided from the host. The data may be stored in a memory area having a storage reliability level corresponding to the required reliability level from among the plurality of memory areas, according to a control of the memory controller.

Embodiments of the disclosure provide a storage device configured to communicate with a host. The storage device may include a plurality of memory devices and a memory controller. Each of the plurality of memory devices may include at least one of a plurality of memory areas. The plurality of memory areas may have different storage reliability levels. The memory controller may control the plurality of memory devices such that data and retention time data associated with required retention time of the data are stored in some or all of the plurality of memory areas. The data and the retention time data may be provided from the host. The data may be stored in a target memory area having the highest storage reliability level from among the plurality of memory areas until the required retention time of the data is expired, according to a control of the memory controller.

Embodiments of the disclosure provide a storage system configured to communicate with a host. The storage system may include one or more storage devices. Each of the one or more storage devices may include one or more memory devices and a memory controller. Each of the one or more memory devices may include at least one of a plurality of memory areas. The plurality of memory areas may have different storage reliability levels. The memory controller may control the one or more memory devices such that data, required level data associated with a required reliability level of the data, and retention time data associated with retention time corresponding to the required reliability level are stored in some or all of the plurality of memory areas. The data and the required level data may be provided from the host. The retention time may be selected to have a longer value as the required reliability level is higher, according to a control of the memory controller. The data may be stored in a memory area having the highest reliability level from among the plurality of memory areas until the retention time of the data is expired, according to the control of the memory controller.

Embodiments of the disclosure provide a data storage device having a memory with data storage locations and a memory controller that maintains, for each of the data storage locations, an association between the data storage locations and an expected reliability of retrieving data from each of the data storage locations or between the data storage locations and an expected remaining utility lifespan of each of the data storage locations.

Embodiments of the disclosure provide a method, executed by a memory controller, for managing the storage of data in a data storage device having data storage locations. The method includes determining, for each of the data storage locations, an expected reliability of retrieving data from the data storage location or an expected remaining utility lifespan of the data storage location. For each of the data storage locations, an association is maintained between the data storage location and the (1) expected reliability of retrieving data from the data storage location or (2) expected remaining utility lifespan of the data storage location.

According to the example embodiments of the present disclosure, data having a high required reliability level or long required retention time may be reliably stored for a long period of time. Thus, time for using a storage device or a storage system may be extended. As a result, the cost consumed to maintain and manage data may be reduced.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings:

FIGS. 16 and 17 are conceptual diagrams for describing exemplary effects obtained by using a storage device according to an example embodiment of the present disclosure;

DETAILED DESCRIPTION OF EMBODIMENTS

Figure 1:
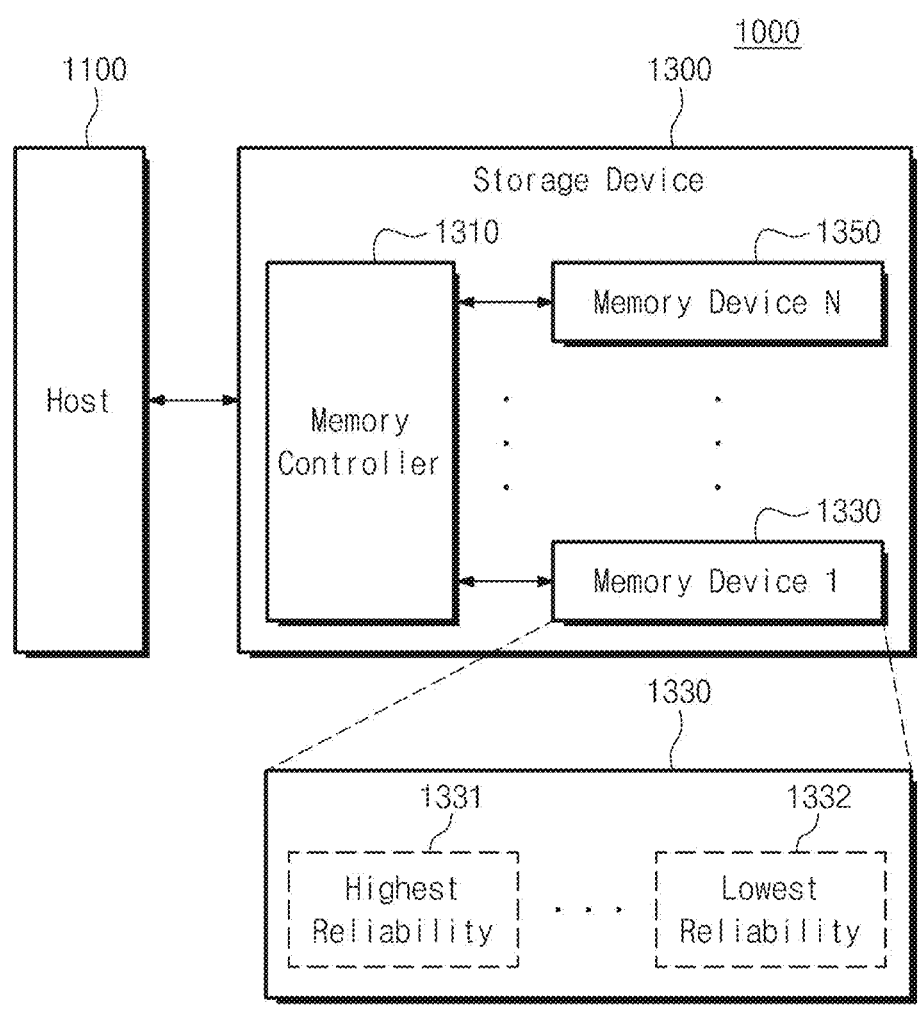
FIG. 1 is a block diagram illustrating an electronic system including a storage device according to an example embodiment of the present disclosure.

The advantages and features of the present disclosure and methods of achieving them will be apparent from the following example embodiments that will be described in more detail with reference to the accompanying drawings. It should be noted, however, that the present disclosure is not limited to the following example embodiments, and may be implemented in various forms. Accordingly, the example embodiments are provided only to disclose the present disclosure and let those skilled in the art know the concept of the present disclosure.

The exemplary drawings may be modified by manufacturing techniques and/or tolerances. Accordingly, the example embodiments of the present disclosure are not limited to specific configurations shown in the drawings, and include modifications based on the method of manufacturing the semiconductor device. Regions or areas shown in the drawings have schematic characteristics. In addition, the shapes of the regions shown in the drawings exemplify specific shapes of regions in an element, and do not limit the present disclosure. Though terms like a first, a second, and a third are used to describe various elements in various example embodiments of the present disclosure, the elements are not limited to these terms. These terms are used only to tell one element from another element. An embodiment described and exemplified herein includes a complementary embodiment thereof.

The terms used in the present disclosure are for the purpose of describing particular embodiments only and are not intended to be limiting of the present disclosure. As used in the specification, the singular forms "a", "an" and "the" are intended to include the plural forms as well, unless the context clearly indicates otherwise. It will be further understood that the terms "comprises" and/or "comprising", when used in the present disclosure, specify the presence of stated features, integers, steps, operations, elements, and/or components, but do not preclude the presence or addition of one or more other features, integers, steps, operations, elements, components, and/or groups thereof.

Hereinafter, example embodiments of the present disclosure will now be described more fully with reference to accompanying drawings.

FIG. 1 is a block diagram illustrating an electronic system including a storage device according to an example embodiment of the present disclosure. An electronic system 1000 may include a host 1100 and a storage device 1300. For instance, the electronic system 1000 may be a unitary system including both the host 1100 and the storage device 1300. Alternatively, the host 1100 and the storage device 1300 of the electronic system 1000 may be implemented in separate devices from each other.

For instance, the host 1100 may be a processor circuit or an electronic device including a general-purposed processor or an application processor. Alternatively, the host 1100 may be a computing device including at least one processor (e.g., a personal computer (PC), a peripheral device, a digital camera, a personal digital assistant (PDA), a portable multimedia player (PMP), a smartphone, a tablet, a wearable device, etc.). However, these examples are not intended to limit the present disclosure.

The storage device 1300 may store data permanently or semi-permanently. The storage device 1300 may be implemented using any storage medium including a nonvolatile memory. For instance, the storage device 1300 may be implemented using a mechanical storage medium such as a hard disk drive (HDD), a storage medium including a flash memory such as a solid state drive (SSD) or the like, but these examples are not intended to limit the present disclosure.

In the description below, it is assumed that the storage device 1300 is a storage medium including a flash memory. However, the storage device 1300 may be implemented using any storage medium including a nonvolatile memory, as mentioned above. The present disclosure may be applied to any storage medium including a nonvolatile memory. The above assumption is merely an example to help understand the present disclosure, and is not intended to limit the present disclosure.

The storage device 1300 may communicate with the host 1100. The storage device 1300 may store data provided from the host 1100 or data to be provided to the host 1100. For instance, the storage device 1300 may communicate with the host 1100 based on one of various wired communication protocols such as universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), and transmission control protocol/internet protocol (TCP/IP), and/or one of various wireless communication protocols such as long term evolution (LTE), worldwide interoperability for microwave access (WiMax), global system for mobile communication (GSM), code division multiple access (CDMA), high speed packet access (HSPA), Bluetooth, near field communication (NFC), wireless fidelity (WiFi), and radio frequency identification (RFID). However, these examples are not intended to limit the present disclosure.

For instance, when the electronic system 1000 is a unitary system including both the host 1100 and the storage device 1300, the storage device 1300 may be a local storage device to store data used in service of the host 1100. For instance, when the host 1100 and the storage device 1300 are implemented in separate devices from each other, the storage device 1300 may be an external or remote storage device. For instance, when the storage device 1300 communicates with the host 1100 based on TCP/IP or at least one of various wireless communication protocols, the storage device 1300 may operate as a storage server and the host 1100 may operate as a client device that accesses the storage device 1300. However, these examples are not intended to limit the present disclosure. The storage device 1300 may be implemented in various forms different from these examples.

The storage device 1300 may include a memory controller 1310 and a plurality of memory devices 1330 and 1350. The memory controller 1310 may control the overall operations of the storage device 1300. In particular, the memory controller 1310 may control operations of the memory devices 1330 and 1350, allowing the storage device 1300 to perform its own functions.

Each of the memory devices 1330 and 1350 may store data. The memory devices 1330 and 1350 may operate according to the control of the memory controller 1310. Each of the memory devices 1330 and 1350 may be a nonvolatile memory device. In FIG. 1, it is illustrated that two memory devices are included in the storage device 1300. However, the configuration shown in FIG. 1 is merely an example to help understand the present disclosure, and the present disclosure is not limited by the configuration shown in FIG. 1. The storage device 1300 may include one or more memory devices, and the number of memory devices included in the storage device 1300 may be variously changed or modified.

The storage device 1300 may further include other components that are not shown in FIG. 1. For instance, the storage device 1300 may further include at least one of an interface circuit to communicate with the host 1100, an input/output circuit to control input and output of data, and a buffer memory to temporarily store data. Hereinafter, for brevity of the description, only configurations and operations of the memory controller 1310 and the memory devices 1330 and 1350 included in the storage device 1300 will be mentioned.

In an example embodiment of the present disclosure, each of the memory devices 1330 and 1350 may include at least one of a plurality of memory areas. That is, each of the memory devices 1330 and 1350 may include one or more memory areas. For instance, the first memory device 1330 may include a plurality of memory areas 1331 and 1332. When the storage device 1300 includes a flash memory, a memory area may be managed in a unit of a logical partition, or may be managed based on an address of a page or a block.

Each of memory devices (e.g., the Nth memory device 1350) other than the first memory device 1330 may have the identical or similar configuration and functions to those of the first memory device 1330. Therefore, the Nth memory device 1350 will not be described in further detail.

As described above, the first memory device 1330 may include memory areas 1331 and 1332. In an example embodiment of the present disclosure, the memory areas 1331 and 1332 may have different storage reliability levels from each other. For instance, the first memory area 1331 of the first memory device 1330 may have a first storage reliability level (e.g., the highest storage reliability level), and the second memory area 1332 of the first memory device 1330 may have a second storage reliability level (e.g., the lowest storage reliability level).

A "storage reliability level" of a memory area indicates how reliably the memory area stores data. The higher a storage reliability level of a memory area is, the more reliably the memory area stores data. On the other hand, the lower a storage reliability level of a memory area is, the less reliably the memory area stores data.

For instance, when the first memory device 1330 includes a flash memory, memory cells included in the first memory device 1330 are deteriorated with repeated program and erase operations. When a small number of program and erase operations are performed at the first memory device 1330, the first memory device 1330 may reliably store data. On the other hand, when a large number of program and erase operations are performed at the first memory device 1330, data stored in the first memory device 1330 may not be reliable.

For instance, a large number of program and erase operations may be performed in one memory area of the first memory device 1330. The one memory area (e.g., the second memory area 1332) may include memory cells that are further deteriorated and have a relatively low storage reliability level. On the other hand, a small number of program and erase operations may be performed in another memory area included in the first memory device 1330. The other memory area (e.g., the first memory area 1331) may include memory cells that are less deteriorated and have a relatively high storage reliability level. To sum up, the first memory device 1330 may include the memory areas 1331 and 1332 that are distinguished based on reliability associated with storing data.

As an example embodiment, when the first memory device 1330 includes a flash memory, the storage reliability level may be determined based on a result of error detection and correction operations performed at the first memory device 1330. For instance, a memory area causing errors more than a reference number may have a low storage reliability level. On the other hand, a memory area causing errors less than the reference number may have a high storage reliability level. The reference number may be differently selected or changed according to the embodiment.

As another example embodiment, when the first memory device 1330 includes a flash memory, the storage reliability level may be determined based on a wear level. For instance, a memory area that performs a large number of program and erase operations and has a wear level larger than a reference value may have a low storage reliability level. On the other hand, a memory area that performs a small number of program and erase operations and has a wear level smaller than the reference value may have a high storage reliability level. The reference value may be differently selected or changed according to the embodiment.

However, the present disclosure is not limited by the above example embodiments. The storage reliability level of a memory area may be determined based on another criterion. For instance, the storage reliability level of a memory area may be determined based on an access pattern with respect to data stored in the memory area. The above example embodiments are merely provided to help understand the present disclosure. The criteria used to determine the storage reliability level of a memory area may be variously changed or modified.

In FIG. 1, it is illustrated that two memory areas are included in the first memory device 1330. However, the configuration shown in FIG. 1 is merely an example to help understand the present disclosure. The number of memory areas included in the first memory device 1330 may be variously changed or modified.

For instance, when the first memory device 1330 is managed based on three or more storage reliability levels, the first memory device 1330 may include three or more memory areas. In some example embodiments, immediately after the storage device 1300 or the first memory device 1330 is manufactured, the first memory device 1330 may include only the first memory area 1331 having the highest storage reliability level. On the other hand, when the life of the storage device 1300 or the first memory device 1330 comes to an end, the first memory device 1330 may include only the second memory area 1332 having the lowest storage reliability level. The present disclosure is not limited by the configuration shown in FIG. 1.

Further, in FIG. 1, a box indicating the first memory area 1331 has the same size as a box indicating the second memory area 1332. However, the box size does not indicate storage capacity of a memory area. Storage capacity of each of memory areas included in the first memory device 1330 may be differently set as necessary, or may vary depending on the lapse of time. The present disclosure is not limited by FIG. 1.

Figure 2:
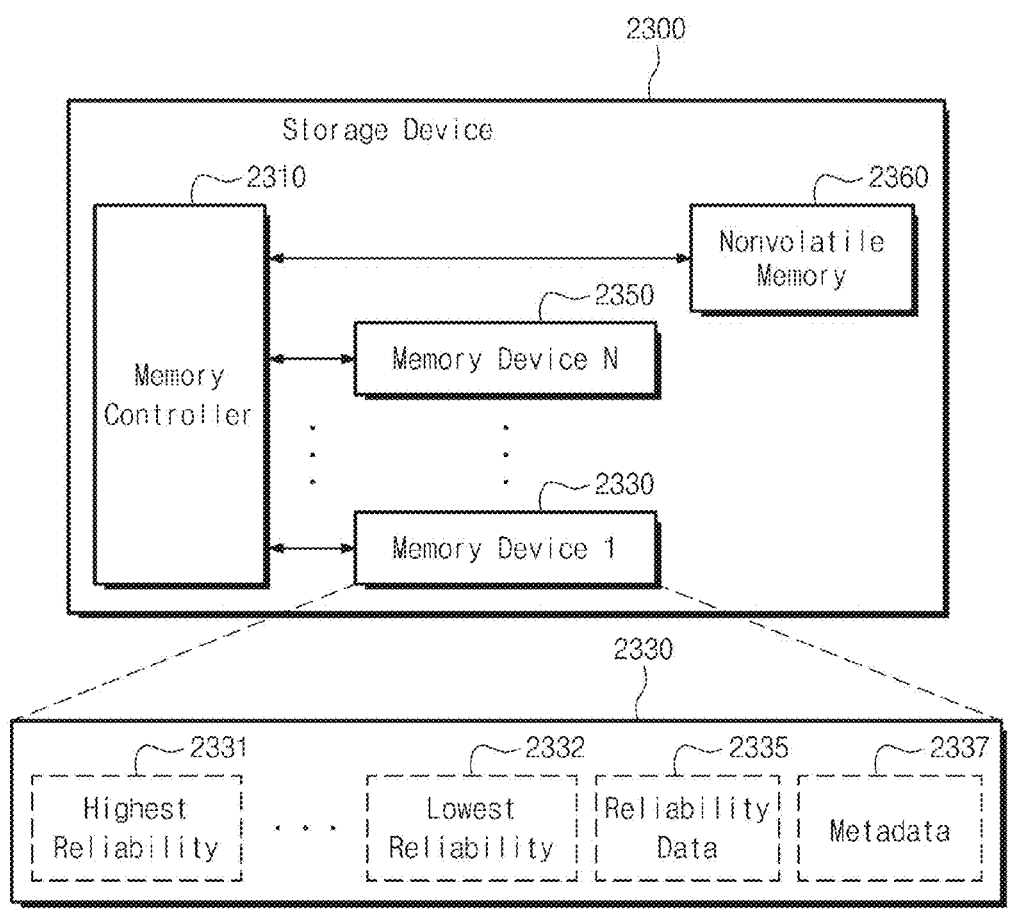
FIG. 2 is a block diagram illustrating a storage device according to an example embodiment of the present disclosure.

FIG. 2 is a block diagram illustrating a storage device according to an example embodiment of the present disclosure. A storage device 2300 may include a memory controller 2310 and a plurality of memory devices 2330 and 2350. In some example embodiments, the storage device 2300 may further include a nonvolatile memory 2360.

The configuration and functions of the memory controller 2310 may include the configuration and functions of the memory controller 1310 in FIG. 1. Redundant descriptions associated with the configuration and functions of the memory controller 2310 will be omitted below for brevity of the description.

The first memory device 2330 may include a first memory area 2331 having the highest storage reliability level and a second memory area 2332 having the lowest storage reliability level. The configurations and functions of the memory areas 2331 and 2332 may include the configurations and functions of the memory areas 1331 and 1332 in FIG. 1. Redundant descriptions associated with the configurations and functions of the memory areas 2331 and 2332 will be omitted below for brevity of the description.

In some example embodiments, the first memory device 2330 may further include a reliability data area 2335 to store storage reliability data. The storage reliability data may include information associated with storage reliability levels of the memory areas 2331 and 2332. In some example embodiments, the first memory device 2330 may further include a metadata area 2337 to store metadata. The metadata may include information associated with data stored in the first memory device 2330 or the storage device 2300.

As an example embodiment, the first memory device 2330 may manage the storage reliability levels of the memory areas 2331 and 2332 to manage the memory areas 2331 and 2332. The first memory device 2330 may store storage reliability data associated with the storage reliability levels to manage the storage reliability levels of the memory areas 2331 and 2332. The first memory device 2330 may manage the memory areas 2331 and 2332 with reference to the storage reliability data.

As an example embodiment, the storage reliability data may be stored in the reliability data area 2335. Some or all portions of the reliability data area 2335 may overlap at least one of the memory areas 2331 and 2332. However, the reliability data area 2335 may not overlap the memory areas 2331 and 2332 to prevent an error of the storage reliability data. In addition, the reliability data area 2335 may be provided separately from the metadata area 2337, in order to prevent an error of the metadata having the highest importance and prevent deterioration of memory cells included in the metadata area 2337. That is, the storage reliability data may be stored in a memory area that does not store other data.

As another example embodiment, the storage reliability data may be stored in the nonvolatile memory 2360. The nonvolatile memory 2360 may be provided separately from the memory devices 2330 and 2350. That is, the storage reliability data may be stored in a separately provided memory. For instance, the nonvolatile memory 2360 may include a flash memory, a phase-change random access memory (PRAM), a magneto-resistive RAM (MRAM), a resistive RAM (ReRAM), a ferro-electric RAM (FRAM), or a combination thereof. However, the present disclosure is not limited by the above examples.

The storage reliability levels of the memory areas 2331 and 2332 may be updated according to the control of the memory controller 2310. The storage reliability levels may vary depending on program and erase operations or the lapse of time. For instance, when the storage device 2300 includes a flash memory, the storage reliability levels may be lowered as memory cells are deteriorated. According to the control of the memory controller 2310, the storage reliability levels may be updated periodically or at each of specific time points, or may be updated based on a specific condition.

In some example embodiments, the storage reliability levels may be updated when a read operation is performed on data stored in the memory areas 2331 and 2332. For instance, when the read operation is performed on the data stored in the memory areas 2331 and 2332, error detection and correction operations may be performed. The storage reliability levels may be updated based on a result of the error detection and correction operations.

In some example embodiments, the storage reliability levels may be updated before an erase operation is performed on data stored in the memory areas 2331 and 2332. For instance, before an erase operation is performed on data stored in the memory areas 2331 and 2332, error detection and correction operations may be arbitrarily performed on the stored data. The storage reliability levels may be updated based on a result of the error detection and correction operations.

In some example embodiments, the storage reliability levels may be updated when an erase operation is performed on data stored in the memory areas 2331 and 2332. For instance, a wear level of one or more pages or blocks included in a memory area may be changed when an erase operation is performed on the memory areas 2331 and 2332. The storage reliability levels may be updated based on the changed wear level.

Storage reliability data including information associated with the updated storage reliability levels may be stored in the reliability data area 2335 and/or the nonvolatile memory 2360. When the nonvolatile memory 2360 is used, the life of the nonvolatile memory 2360 needs to be long enough to frequently update the storage reliability data.

However, in other example embodiments, the first memory device 2330 may further include other types of memory areas that are not shown in FIG. 2. The storage device 2300 may further include other components that are not shown in FIG. 2. The components shown in FIG. 2 are merely examples to help understand the present disclosure, and are not intended to limit the present disclosure. Each of memory devices (e.g., the Nth memory device 2350) other than the first memory device 2330 may have the identical or similar configuration and function to those of the first memory device 2330. Therefore, the Nth memory device 2350 will not be described in further detail.

Figure 3:
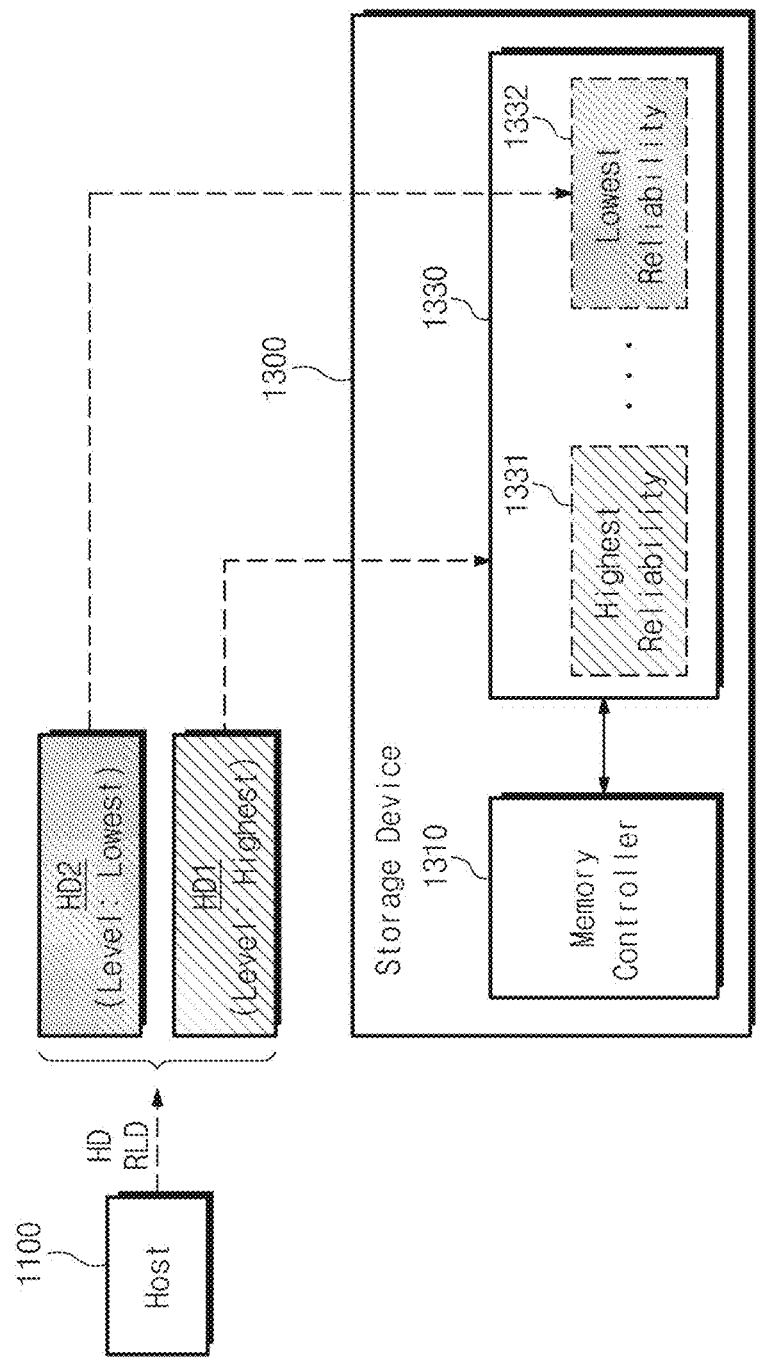
FIG. 3 is a conceptual diagram illustrating a process of storing data in a storage device of FIG. 1 according to an example embodiment of the present disclosure.

FIG. 3 is a conceptual diagram illustrating a process of storing data in a storage device of FIG. 1 according to an example embodiment of the present disclosure. For brevity of the description, it is illustrated in FIG. 3 that the storage device 1300 includes only a first memory device 1330. However, the present disclosure is not limited by the configuration shown in FIG. 3. The number of memory devices included in the storage device 1300 may be variously changed or modified.

A host 1100 may provide data HD to the storage device 1300. The data HD is generated by the host 1100 and is to be stored in the storage device 1300.

As an example embodiment, the host 1100 may further provide required level data RLD to the storage device 1300. The required level data RLD may include information associated with a required reliability level of the data HD. The required reliability level of the data HD indicates how reliably the data HD needs to be stored. The higher the required reliability level of the data HD is, the more reliably the data HD needs to be stored. On the other hand, the lower the required reliability level of the data HD is, the less reliably the data HD may be stored.

In some example embodiments, the required reliability level of the data HD may be set by a user of the host 1100 based on the importance of the data HD. In this example embodiment, the host 1100 may include a user interface used to set the required reliability level of the data HD.

In some example embodiments, the required reliability level of the data HD may be selected based on a management policy of the host 1100. For instance, when original data or copy data of the data HD is stored in another storage device or storage system (e.g., when original data of the data HD is stored in a cloud storage, when the data HD is cache data, etc.), the data HD may have a low required reliability level. This is because the data HD may be restored using the original data or the copy data even when the data HD is lost.

On the other hand, when the data HD is single original data (e.g., when the data HD is data of a tiering system, etc.), the data HD may have a high required reliability level. However, the above examples are merely provided to help understand the present disclosure. The criteria used to determine the required reliability level of the data HD may be variously changed or modified. Another example will be mentioned with reference to FIGS. 16 and 17.

The data HD and the required level data RLD may be stored in some or all of a plurality of memory areas included in the storage device 1300. The memory controller 1310 may control memory devices (e.g., the first memory devices 1330) to store the data HD and the required level data RLD in some or all of the memory areas. For instance, the data HD and the required level data RLD may be stored in the first memory device 1330. However, this example is merely provided to help understand the present disclosure. The data HD and the required level data RLD may stored in another memory device included in the storage device 1300.

In an example embodiment of the present disclosure, the data HD may be stored in a memory area that has a storage reliability level corresponding to a required reliability level of the data HD, according to the control of the memory controller 1310. For instance, first data HD1 having the highest required reliability level needs to be stored reliably. Accordingly, the first data HD1 may be stored in a first memory area 1331 having the highest storage reliability level. On the other hand, it may be fine for second data HD2 having the lowest required reliability level to be stored relatively less reliably. Accordingly, the second data HD2 may be stored in a second memory area 1332 having the lowest storage reliability level. In an example embodiment, as a required reliability level of data HD is higher, the data HD may be stored in a memory area having a higher storage reliability level.

In some cases (e.g., immediately after the storage device 1300 or the first memory device 1330 is manufactured), the first memory device 1330 may include only the first memory area 1331 having the highest storage reliability level. In this case, the second data HD2 may be stored in the first memory area 1331.

On the other hand, in some cases (e.g., when the life of the first memory device 1330 comes to an end), the first memory device 1330 may include only the second memory area 1332 having the lowest storage reliability level. In this case, the first data HD1 may not be stored in the second memory area 1332. This is because when the first data HD1 is stored in the second memory area 1332, it is difficult to reliably store the first data HD1. Example embodiments concerned with this case will be mentioned with respect to FIGS. 4, 5, and 7.

In some example embodiments, error detection and correction operations may be performed on the data HD stored in the storage device 1300 according to the control of the memory controller 1300. For instance, when a read operation is performed on the data HD stored in the storage device 1300, error detection and correction operations may be performed to provide accurate data to the host 1100.

As an example embodiment, as the required reliability level of the stored data HD is higher, error detection and correction operations may be performed more precisely. For instance, error detection and correction operations performed on the first data HD1 having a higher required reliability level than the second data HD2 may be performed more precisely than error correction and detection operations performed on the second data HD2. In an example embodiment, the host 1100 may include a user interface used to set the precision of the error detection and correction operations performed on the data HD.

The memory controller 1310 may be configured to control memory devices. For instance, the memory controller 1310 may be implemented using hardware. The memory controller 1310 may include a first logic circuit used to determine a required reliability level of the data HD, a second logic circuit used to determine a storage reliability level of a memory area, a third logic circuit used to store the data HD in an appropriate memory area, and so on. For another instance, the memory controller 1310 may be implemented using one or more processors configured to execute a machine-executable instruction. The memory controller 1310 may execute an embedded instruction, an instruction stored in a read-only memory (ROM), and the like, in order to control memory devices.

Figure 4:
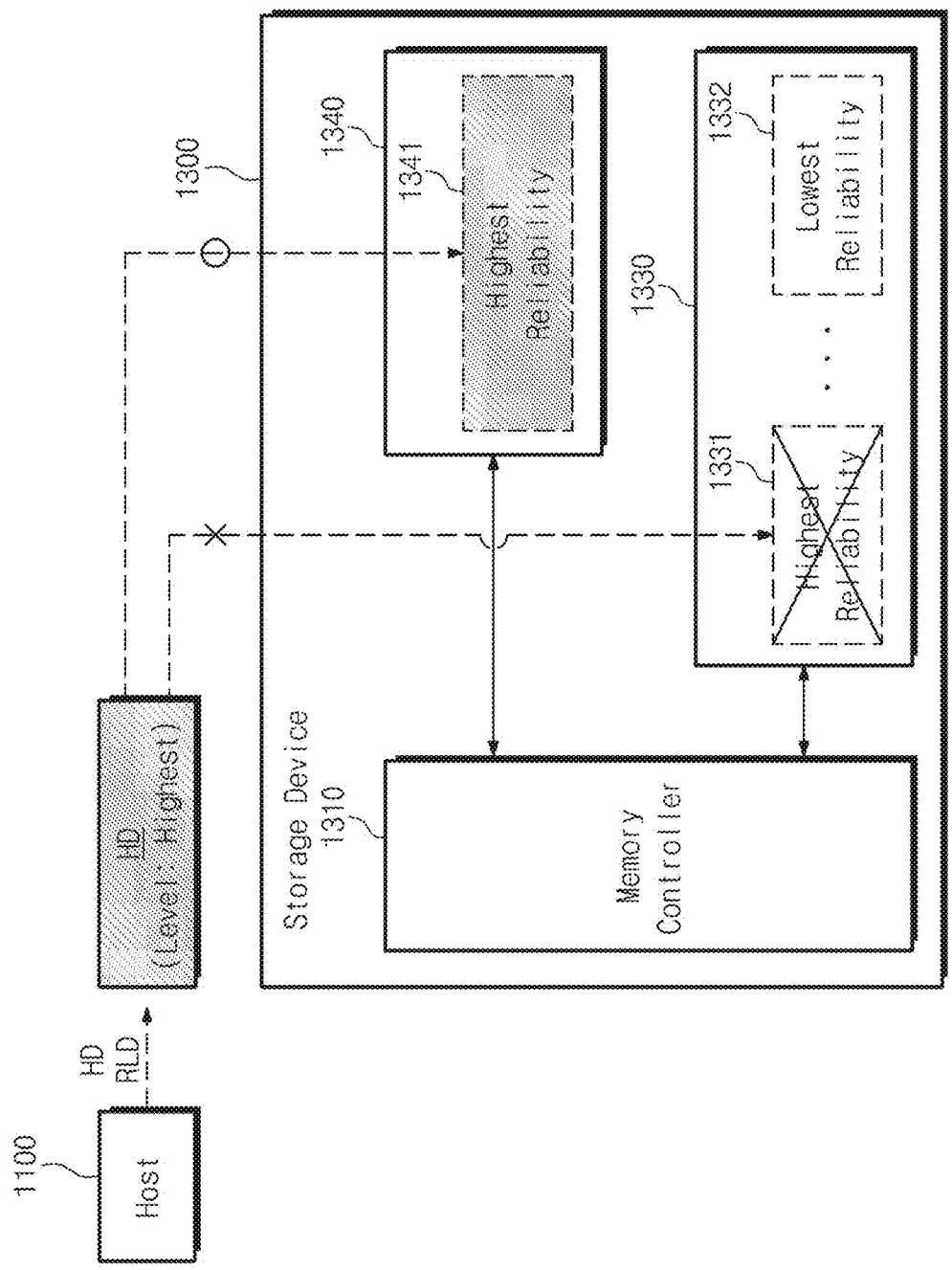
FIG. 4 is a conceptual diagram illustrating another process of storing data in a storage device of FIG. 1 according to an example embodiment of the present disclosure.

FIG. 4 is a conceptual diagram illustrating another process of storing data in a storage device of FIG. 1 according to an example embodiment of the present disclosure. For brevity of the description, it is illustrated in FIG. 4 that the storage device 1300 includes a first memory device 1330 and a second memory device 1340, and the second memory device 1340 includes only a third memory area 1341 having the highest storage reliability level. However, the present disclosure is not limited by the configuration shown in FIG. 4. The number of memory devices included in the storage device 1300 and the number of memory areas included in any memory device may be variously changed or modified.

In some cases (e.g., when the life of the first memory 1330 comes to an end), the first memory device 1330 may not include a first memory area 1331 having the highest storage reliability level. Alternatively, an available space may not exist or may be insufficient in the first memory area 1331 of the first memory device 1330. In this case, data HD having the highest required reliability level may not be stored in the second memory area 1332 of the first memory device 1330. This is because when the data HD is stored in the second memory area 1332, it is difficult to reliably store the data HD.

As an example embodiment, the data HD may be stored in a third memory area 1341 having the highest storage reliability level in the second memory device 1340, according to the control of the memory controller 1310. In some example embodiments, the memory controller 1310 may monitor capacities of available spaces of the memory devices 1330 and 1340. In this example embodiment, the memory controller 1310 may determine a memory device (e.g., the second memory device 1340) that is suitable to store the data HD based on a monitoring result.

In some example embodiments, when a memory device (e.g., the first memory device 1330) including an insufficient available space receives the data HD, the memory device may return an error signal to the memory controller 1310. In this example embodiment, the memory controller 1310 may search another memory device (e.g., the second memory device 1340) that is suitable to store the data HD, in response to the error signal. However, these example embodiments are merely provided to help understand the present disclosure, and are not intended to limit the present disclosure.

In the description referring to FIG. 4, the data HD having the highest required reliability level, the first storage device 1330, and the second storage device 1340 have been mentioned. However, the example embodiments mentioned with reference to FIG. 4 may be applied to data having another required reliability level or other storage devices. To sum up, when an available space does not exist or is insufficient in a memory area that is included in one memory device and has a storage reliability level corresponding to a required reliability level of the data HD, the data HD may be stored in another memory area that is included in another memory device and has the storage reliability level corresponding to the required reliability level of the data HD, according to the control of the memory controller 1310.

Figure 5:
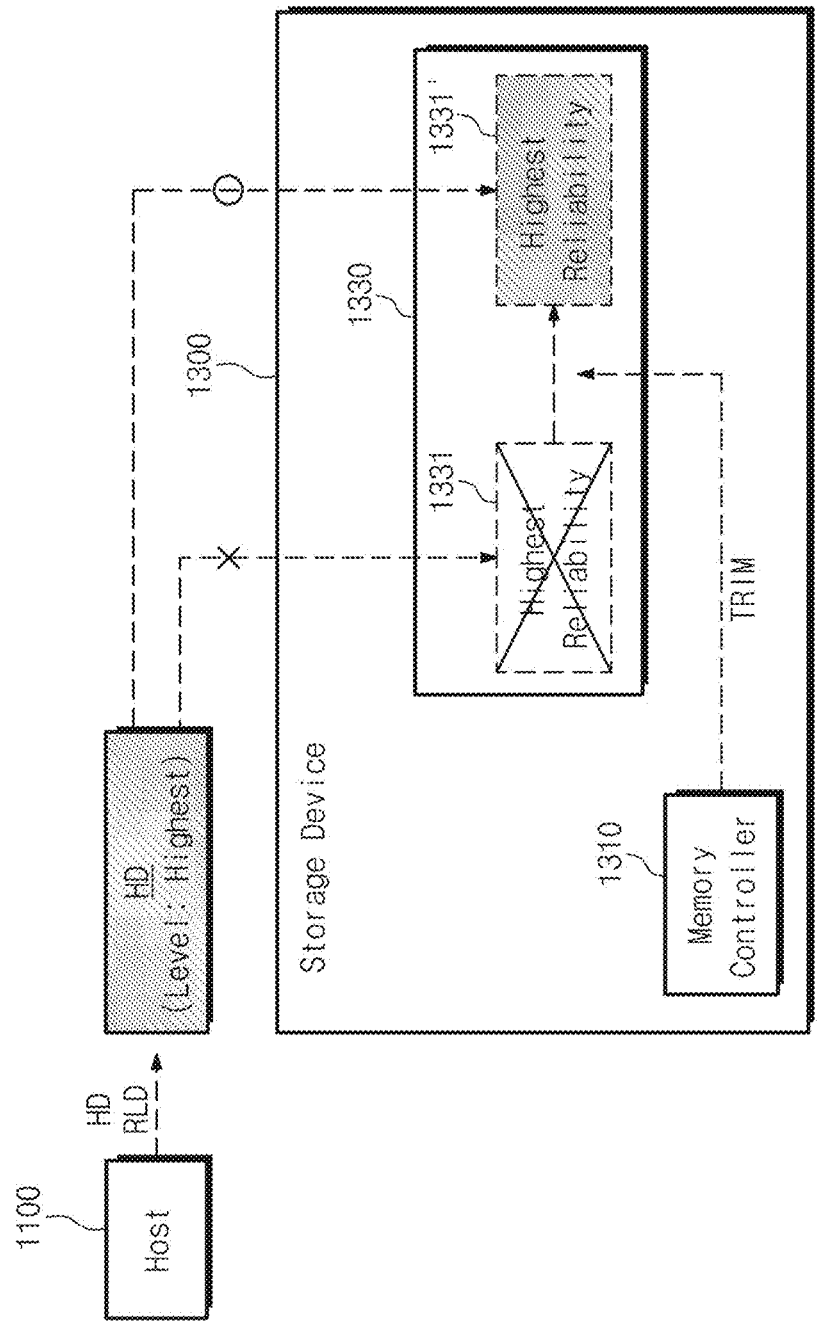
FIG. 5 is a conceptual diagram illustrating still another process of storing data in a storage device of FIG. 1 according to an example embodiment of the present disclosure.

FIG. 5 is a conceptual diagram illustrating still another process of storing data in a storage device of FIG. 1 according to an example embodiment of the present disclosure. For brevity of the description, it is illustrated in FIG. 5 that the storage device 1300 includes only a first memory device 1330. However, the present disclosure is not limited by the configuration shown in FIG. 5. The number of memory devices included in the storage device 1300 may be variously changed or modified.

As mentioned above, in some cases (e.g., when the life of the first memory device 1330 comes to an end), the first memory device 1330 may not include a first memory area 1331 having the highest storage reliability level. Alternatively, an available space may not exist or may be insufficient in the first memory area 1331 of the first memory device 1330.

As an example embodiment, invalid data of the first memory area 1331 may be deleted according to the control of the memory controller 1310. For instance, the memory controller 1310 may monitor capacities of memory areas included in the first memory device 1330. The memory controller 1310 may provide a trimming command TRIM to the first memory device 1330, in order to delete the invalid data based on a monitoring result. For another instance, when a memory device (e.g., the first memory device 1330) including an insufficient available space receives data HD, the memory device may return an error signal to the memory controller 1310. The memory controller 1310 may provide the trimming command TRIM to the first memory device 1330 in response to the error signal.

When the trimming command TRIM is provided to the first memory device 1330, the invalid data of the first memory area 1331 may be deleted. After the invalid data of the first memory area 1331 is deleted, a trimmed first memory area 1331' may be generated. The trimmed first memory area 1331' may include a sufficient available space. The data HD having the highest required reliability level may be stored in the trimmed first memory area 1331' having the highest storage reliability level.

In the description with reference to FIG. 5, the data HD having the highest required reliability level, the first memory device 1330, and the trimming command TRIM have been mentioned. However, these examples are merely provided to help understand the present disclosure, and are not intended to limit the present disclosure. The example embodiment mentioned with reference to FIG. 5 may be applied to data having another required reliability level or other storage devices. Furthermore, another command, such as a garbage collection command, may be used to delete invalid data. To sum up, when an available space does not exist or is insufficient in a memory area having a storage reliability level corresponding to a required reliability level of the data HD, invalid data of the memory area having the storage reliability level corresponding to the required reliability level of the data HD may be deleted. After the invalid data is deleted, the data HD may be stored.

Figure 6:
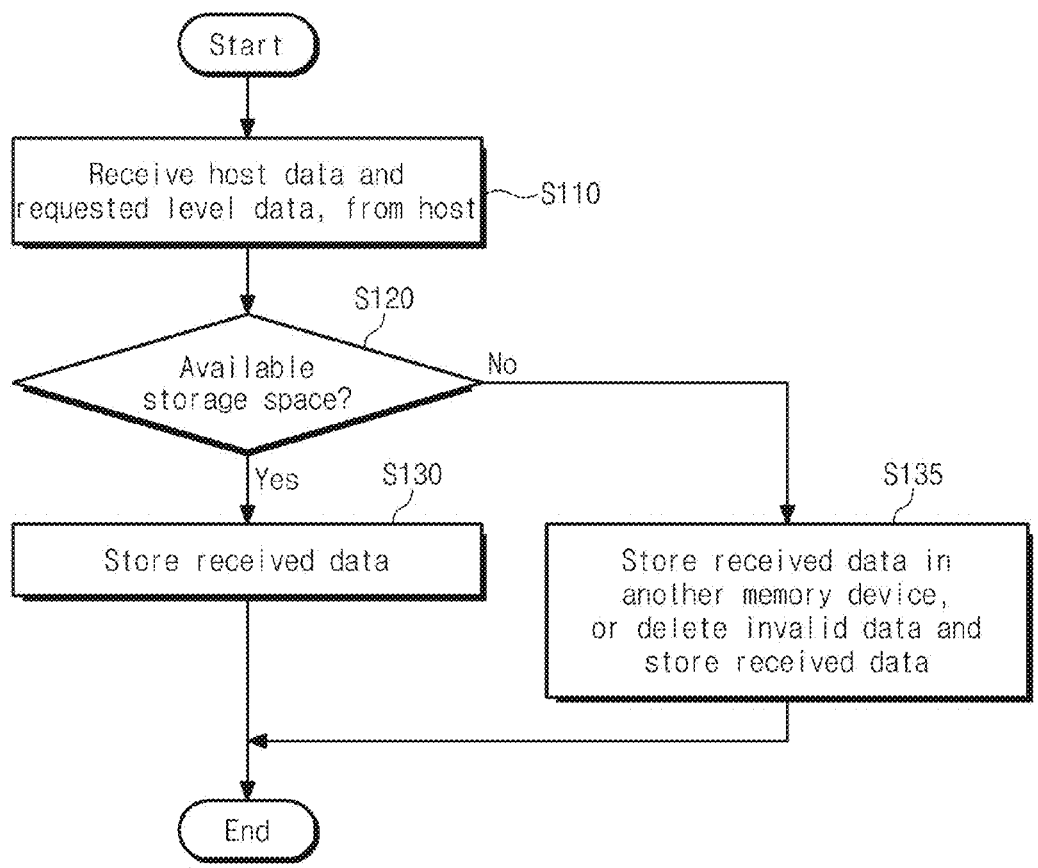
FIG. 6 is a flowchart describing a process of storing data in a storage device of FIG. 1 according to an example embodiment of the present disclosure.

FIG. 6 is a flowchart describing a process of storing data in a storage device of FIG. 1 according to an example embodiment of the present disclosure.

In operation S110, a storage device 1300 (see FIG. 1) may receive data HD (see FIG. 3) and required level data RLD (see FIG. 3). The data HD and the required level data RLD have been described with reference to FIG. 3.

In operation S120, a memory controller 1310 (see FIG. 1) may determine whether an available space exists in one memory area having a storage reliability level corresponding to a required reliability level of the data HD received in operation S110. The storage reliability level has been described with reference to FIGS. 1 and 2, and the required reliability level has been described with reference to FIG. 3. When the available space exists, the method proceeds to operation S130. On the other hand, when the available space does not exist or is insufficient, the method proceeds to operation S135.

In operation S130, the received data HD may be stored. The data HD may be stored in a memory area having the storage reliability level corresponding to the required reliability level of the data HD. For instance, the required level data RLD may be stored in the same memory area as the data HD, or stored in a different memory area from the data HD. Alternatively, the required level data RLD may be stored in the reliability data area 2335 (see FIG. 2) or the nonvolatile memory 2360 (see FIG. 2) together with storage reliability data. However, these examples are merely exemplary, and the present disclosure is not limited by these examples.

In operation S135, as an example embodiment, the data HD received in operation S110 may be stored in a memory area that is included in another memory device and has the storage reliability level corresponding to the required reliability level of the data HD. This example embodiment has been described with reference to FIG. 4. As another example embodiment, invalid data of the memory area having the storage reliability level corresponding to the required reliability level of the data HD may be deleted. After the invalid data is deleted, the received data HD may be stored. This example embodiment has been described with reference to FIG. 5.

Figure 7:
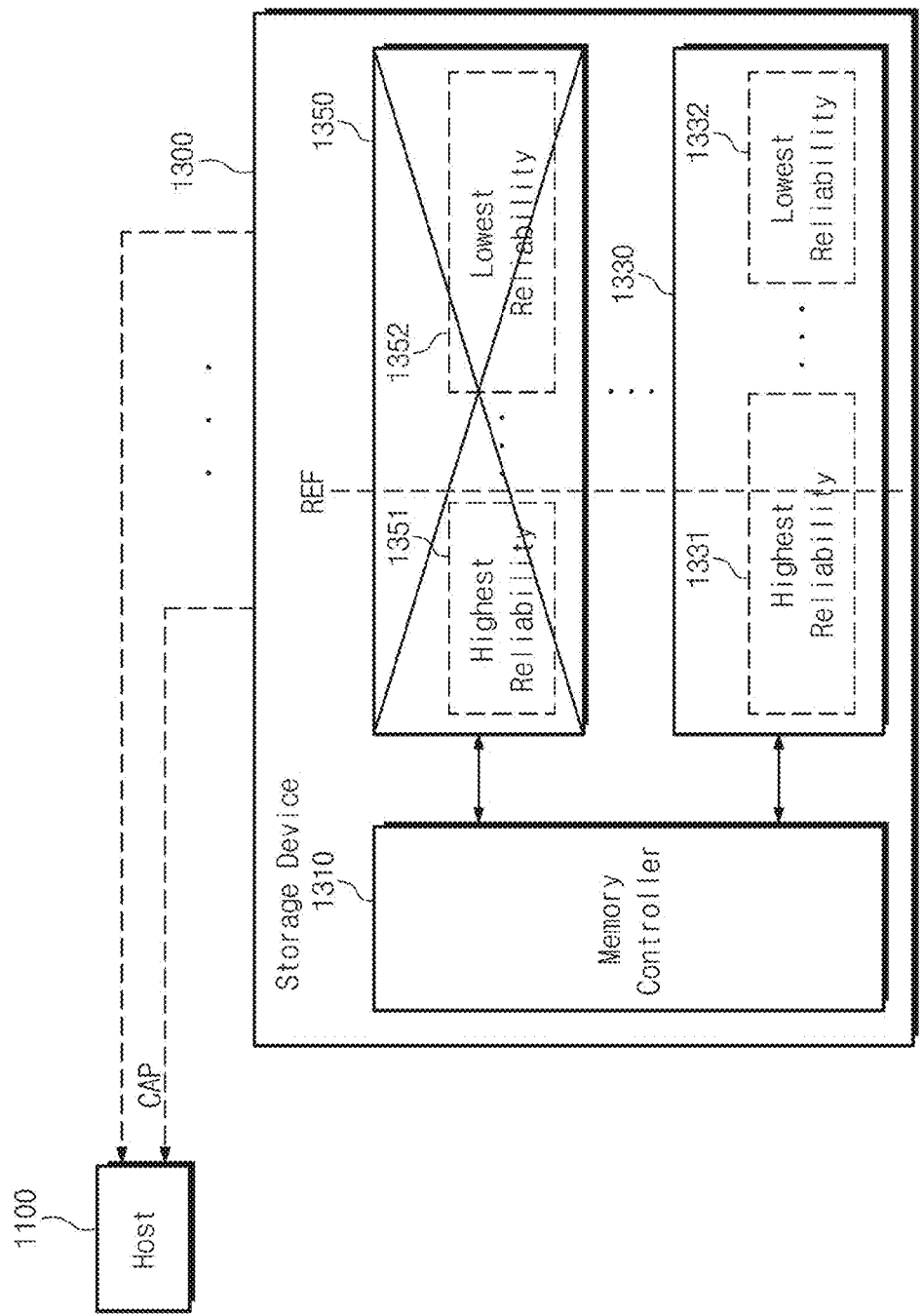
FIG. 7 is a conceptual diagram illustrating a process of managing a memory device of FIG. 1 according to an example embodiment of the present disclosure.

FIG. 7 is a conceptual diagram illustrating a process of managing a memory device of FIG. 1 according to an example embodiment of the present disclosure. For brevity of the description, it is illustrated in FIG. 7 that the storage device 1300 includes a first memory device 1330 and an Nth memory device 1350. However, the present disclosure is not limited by the configuration shown in FIG. 7. The number of memory devices included in the storage device 1300 and the number of memory areas included in a memory device may be variously changed or modified.

Data HD (see FIG. 3) may have a high required reliability level or a low required reliability level. Data HD having a low required reliability level may be stored in a memory area having a low storage reliability level. However, the data HD having the low required reliability level may be stored in a memory area having a high storage reliability level. On the other hand, data HD having a high required reliability level needs to be stored in the memory area having the high storage reliability level. Thus, at least, the total storage capacity of the memory area having the high storage reliability level needs to be managed.

For instance, the memory devices 1330 and 1350 may include memory areas 1331 and 1351 having the highest storage reliability level, respectively. In some example embodiments, the memory controller 1310 may monitor the total storage capacity of each of the memory areas 1331 and 1351 having the highest storage reliability level. As an example embodiment, when the total storage capacity of the memory area having the highest storage reliability level is smaller than a reference value REF, a memory device including the memory area may not be used to store the data HD, according to the control of the memory controller 1310.

In FIG. 7, the total storage capacity of the first memory area 1331 having the highest storage reliability level may be greater than the reference value REF. Thus, the first memory device 1330 including the first memory area 1331 may be used to store the data HD. On the other hand, the total storage capacity of a fourth memory area 1351 having the highest storage reliability level may be smaller than the reference value REF. In the near future, it may become difficult to reliably store the data HD having the highest required reliability level in the Nth memory device 1350 including the fourth memory area 1351. Accordingly, the Nth memory device 1350 including the fourth memory area 1351 may not be used to store the data HD.

To sum up, when the total storage capacity of a memory area that is included in a specific memory device and has the highest storage reliability level is smaller than the reference value REF, the specific memory device may not be used to store the data HD, according to the control of the memory controller 1310. The specific memory device may store only data HD having a low required reliability level, or may be discarded. For achieving this, the memory controller 1310 may monitor the total storage capacity of each memory area having the highest storage reliability level periodically or at each of specific time points, or based on a specific condition. The reference value may be differently selected or changed according to the embodiment.

In some example embodiments, information CAP associated with the total storage capacities of respective memory areas 1331, 1332, 1351, and 1352 may be provided to the host 1100, according to the control of the memory controller 1310. A user of the host 1100 may monitor storage capacities of the respective memory areas 1331, 1332, 1351, and 1352 based on the provided information CAP. In this example embodiment, the host 1100 may include a user interface used to determine whether a specific memory device is discarded based on the provided information CAP.

Figure 8:
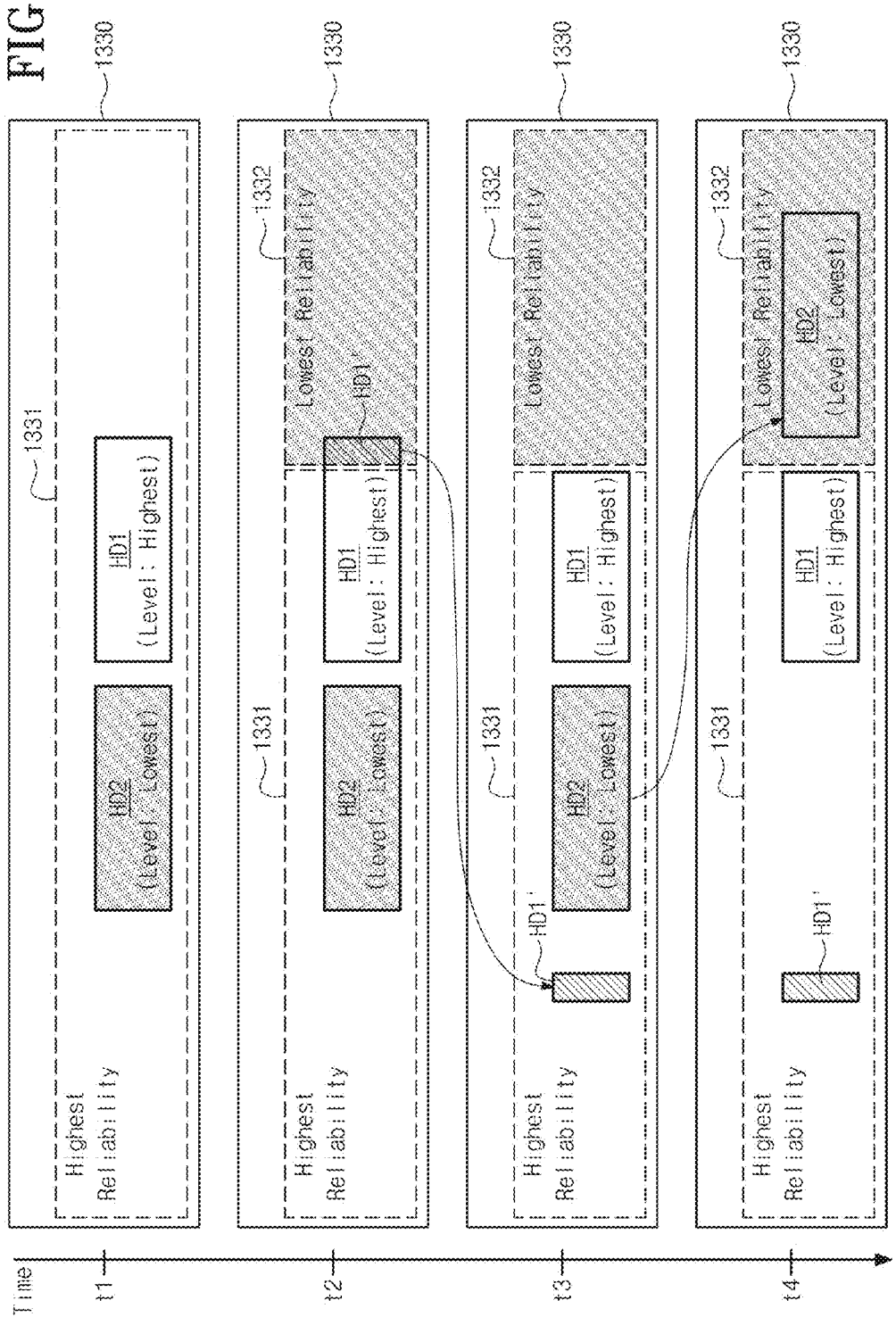
FIG. 8 is a conceptual diagram illustrating a process of managing data stored in a memory area of FIG. 1 according to an example embodiment of the present disclosure.

FIG. 8 is a conceptual diagram illustrating a process of managing data stored in a memory area of FIG. 1 according to an example embodiment of the present disclosure. For brevity of the description, it is illustrated in FIG. 8 that a storage device 1300 (see FIG. 1) includes only a first memory device 1330, and two required reliability levels and two storage reliability levels are used. However, the present disclosure is not limited by the configuration shown in FIG. 8. The number of memory devices included in the storage device 1300, the number of memory areas included in a memory device, the number of required reliability levels, and the number of storage reliability levels may be variously changed or modified.

FIG. 8 illustrates a process of managing data HD1 and HD2 depending on the lapse of time, from "t1" to "t4". At time "t1", memory cells included in the first memory device 1330 are deteriorated little. Accordingly, the first memory device 1330 may include only a first memory area 1331 having the highest storage reliability level. For instance, the first memory area 1331 may store both first data HD1 having the highest required reliability level and second data HD2 having the lowest required reliability level.

At time "t2", some of the memory cells included in the first memory device 1330 are deteriorated much (e.g., due to repeated program and erase operations when the first memory device 1330 includes a flash memory). Accordingly, the first memory device 1330 may include not only the first memory area 1331 but also a second memory area 1332 having the lowest storage reliability level. For instance, as the second memory area 1332 is generated, a part HD1' of the first data HD1 may belong to the second memory area 1332. However, the first data HD1 has the highest required reliability level. When the first data HD1 belongs to the second memory area 1332, it is difficult to reliably store the first data HD1.

At time "t3", as an example embodiment, the part HD1' of the first data HD1 may be moved to the first memory area 1331 having the highest storage reliability level, according to the control of the memory controller 1310 (see FIG. 1). Further, at time "t4", as an example embodiment, the second data HD2 may be moved to the second memory area 1332, according to the control of the memory controller 1310. As a result, the first data HD1 may be reliably stored. In addition, an available space of the first memory area 1331 may be secured.

To sum up, when a storage reliability level of a memory area storing specific data is changed into another storage reliability level, the specific data may be moved to another memory area having a storage reliability level corresponding to a required reliability level of the specific data. According to the example embodiment described with reference to FIG. 8, a single memory area may store data having the same required reliability level.

For instance, the process of moving the data HD1 and HD2 may be performed immediately after the storage reliability level is changed. Alternatively, the process of moving the data HD1 and HD2 may be performed periodically or at each of specific time points, or may be performed based on a specific condition. For instance, when a garbage collection operation is performed at the storage device 1300 or the first memory device 1330, the data HD1 and HD2 may be moved. However, the above examples are merely provided to help understand the present disclosure, and are not intended to limit the present disclosure.

In FIG. 8, it is illustrated that the data HD1 and HD2 are moved within the same memory device (e.g., the first memory device 1330). However, in some example embodiments, the data HD1 and HD2 may be moved to another memory device.

Figure 9:
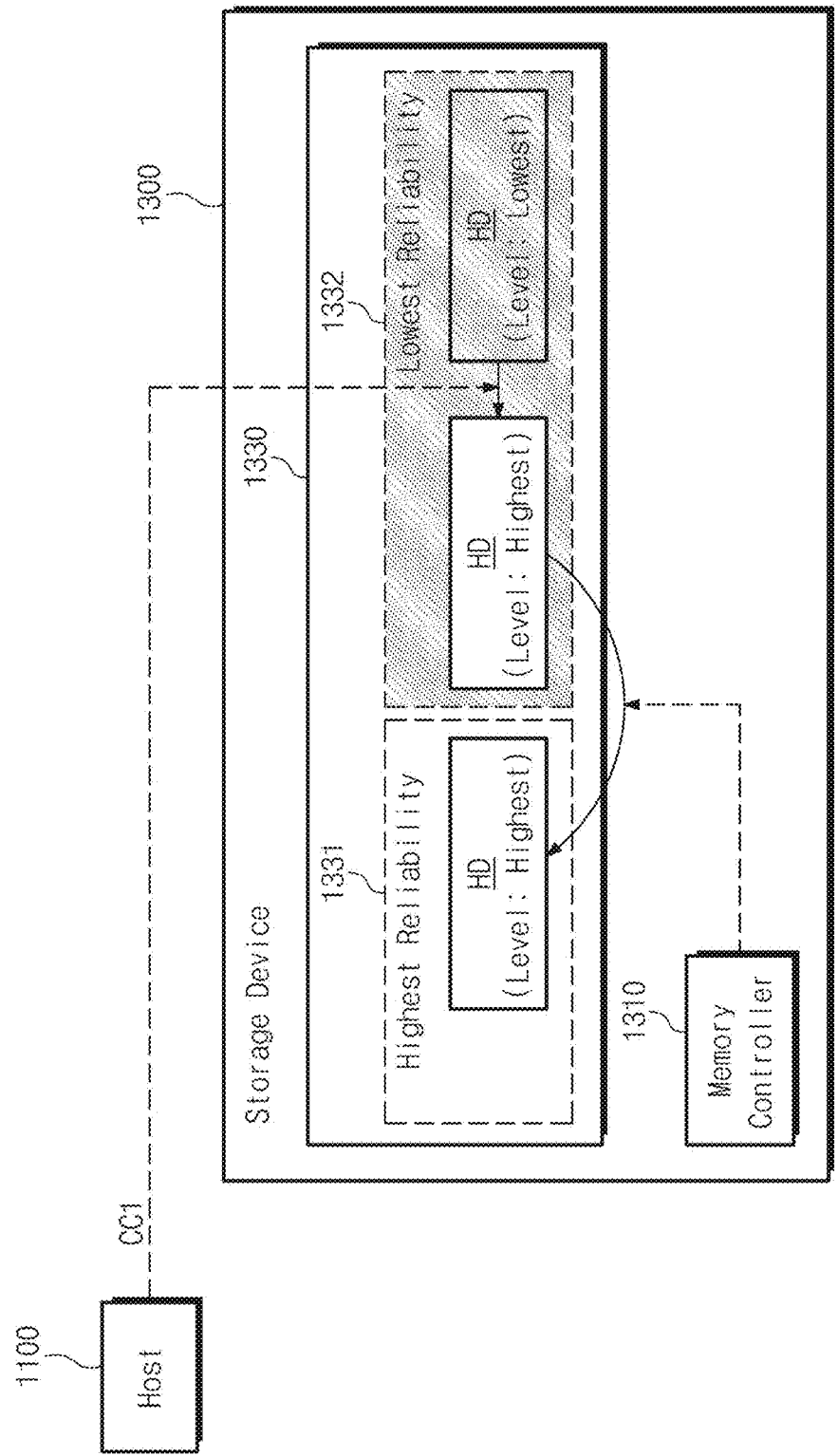
FIG. 9 is a conceptual diagram illustrating another process of managing data stored in a memory area of FIG. 1 according to an example embodiment of the present disclosure.

FIG. 9 is a conceptual diagram illustrating another process of managing data stored in a memory area of FIG. 1 according to an example embodiment of the present disclosure. For brevity of the description, it is illustrated in FIG. 9 that a storage device 1300 includes only a first memory device 1330, and the first memory device 1330 includes two memory areas 1331 and 1332. However, the present disclosure is not limited by the configuration shown in FIG. 9. The number of memory devices included in the storage device 1300 and the number of memory areas included in a memory device may be variously changed or modified.

As an example embodiment, a host 1100 may provide a change command CC1 to the storage device 1300. The change command CC1 may be used to change a required reliability level of data HD. When the change command CC1 is provided from the host 1100, the required reliability level of the data HD, that is a target of change, may be changed into another required reliability level. In this example embodiment, the host 1100 may include a user interface used to change the required reliability level of the data HD.

For instance, a second memory area 1332 having the lowest storage reliability level may store the data HD having the lowest required reliability level. The host 1100 (e.g., a user of the host 1100) may provide the change command CC1 to the storage device 1300, in order to change the lowest required reliability level of the data HD into the highest required reliability level. The required reliability level of the data HD may be changed in response to the change command CC1.

As mentioned above, required level data RLD (see FIG. 3) including information associated with the required reliability level of the data HD may be stored in the storage device 1300 or the nonvolatile memory 2360 (see FIG. 2). When the change command CC1 is provided, the required level data RLD may be changed (i.e., updated) into new required level data including information associated with another required reliability level (i.e., a new changed required reliability level).

As an example embodiment, when the required reliability level of the data HD is changed into a new required reliability level, the data HD may be moved to a memory area having another storage reliability level corresponding to the new required reliability level. For instance, the data HD changed to have the highest required reliability level may be moved to the first memory area 1331 having the highest storage reliability level from the second memory area 1332 having the lowest storage reliability level. Thus, the data HD may be reliably stored.

For instance, the process of moving the data HD may be performed immediately after the required reliability level is changed. Alternatively, the process of moving the data HD may be performed periodically or at each of specific time points, or based on a specific condition. For instance, when a garbage collection operation is performed at the storage device 1300 or the first memory device 1330, the data HD may be moved. However, the above examples are merely provided to help understand the present disclosure, and are not intended to limit the present disclosure.

In FIG. 9, it is illustrated that the data HD is moved within the same memory device (e.g., the first memory device 1330). However, in some example embodiments, the data HD may be moved to another memory device. Furthermore, the example embodiment mentioned described with reference to FIG. 9 may be applied to cases other than a case where the required reliability level of the data HD is changed from the lowest level to the highest level. FIG. 9 is merely an example to help understand the present disclosure.

Figure 10:
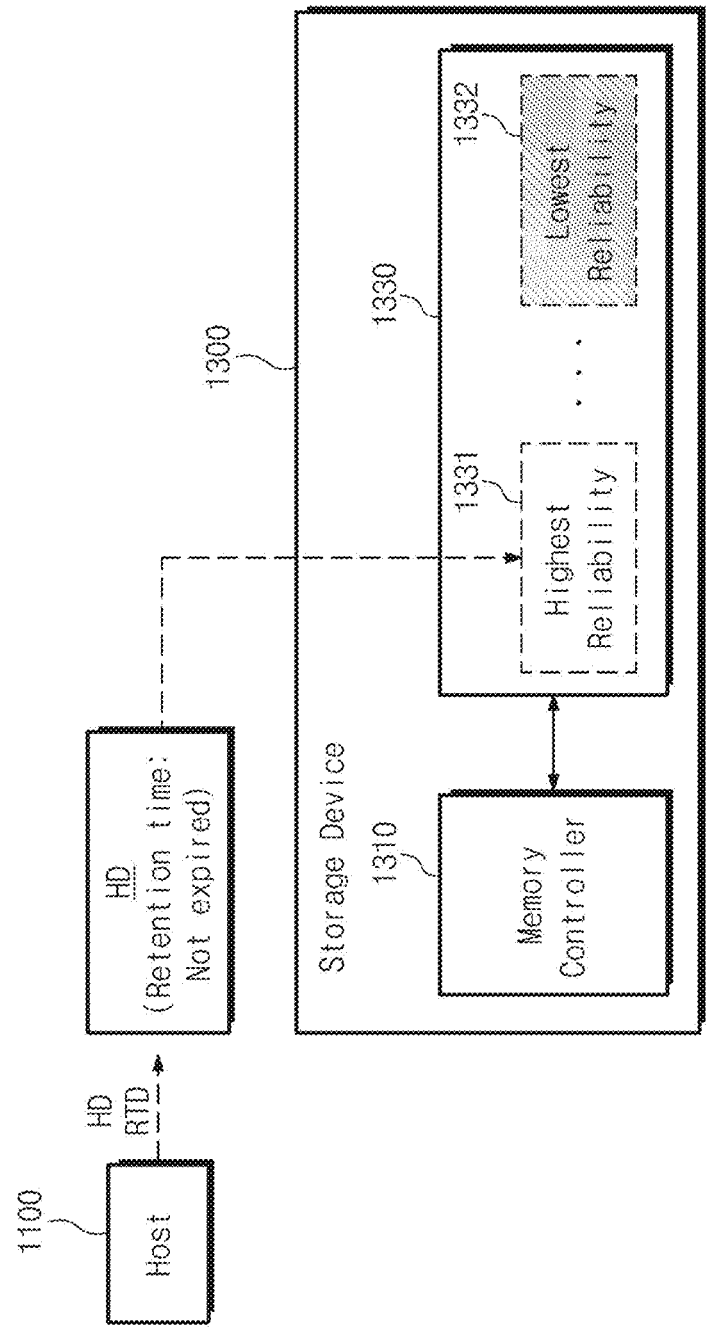
FIG. 10 is a conceptual diagram illustrating a process of storing data in a storage device of FIG. 1 according to another example embodiment of the present disclosure.

FIG. 10 is a conceptual diagram illustrating a process of storing data in a storage device of FIG. 1 according to another example embodiment of the present disclosure. For brevity of the description, it is illustrated in FIG. 10 that the storage device 1300 includes only a first memory device 1330. However, the present disclosure is not limited by the configuration shown in FIG. 10. The number of memory devices included in the storage device 1300 may be variously changed or modified.

A host 1100 may provide data HD to the storage device 1300. In an example embodiment, the host 1100 may further provide retention time data RTD to the storage device 1300. The retention time data RTD may include information associated with required retention time of the data HD. The required retention time of the data HD indicates a time for which the data HD needs to be retained.

For instance, the longer the required retention time of the data HD is, the longer the data HD may be retained. On the other hand, the shorter the required retention time of the data HD is, the shorter the data HD may be retained. The data HD that needs to be retained longer may have longer required retention time.

In some example embodiments, the required retention time of the data HD may be set by a user of the host 1100. In this example embodiment, the host 1100 may include a user interface used to set the required retention time of the data HD. For instance, a user who desires to retain the data HD longer may input long required retention time through the user interface. In some other example embodiments, the required retention time of the data HD may be set based on a management policy of the host 1100.

The data HD and the retention time data RTD may be stored in some or all of a plurality of memory areas included in the storage device 1300. The memory controller 1310 may control memory devices to store the data HD and the retention time data RTD in some or all of the memory areas 1331 and 1332. For instance, the data HD and the retention time data RTD may be stored in the first memory device 1330. However, this example is merely provided to help understand the present disclosure. The data HD and the retention time data RTD may be stored in another memory device included in the storage device 1300.

As an example embodiment of the present disclosure, the data HD may be stored in the first memory area 1331 having the highest storage reliability level according to the control of the memory controller 1310. Since the required retention time indicates the time required to retain the data HD, the data HD needs to be reliably retained before the required retention time is expired. Thus, the data HD may be stored in the first memory area 1331 having the highest storage reliability level before the required retention time is expired, according to the control of the memory controller 1310.

As an example embodiment, the data HD may be deleted from the storage device 1300 when the required retention time of the data HD is expired. As another example embodiment, the data HD may be stored in a memory area having the lowest storage reliability level when the required retention time of the data HD is expired. The description of these example embodiments will be mentioned with reference to FIG. 13. However, these example embodiments are not intended to limit the present disclosure.

In some example embodiments, when an available space does not exist or is insufficient in the first memory area 1331, the data HD may be stored not in the first memory device 1330 but in another memory device according to the control of the memory controller 1310, as mentioned with reference to FIG. 4. In some example embodiments, when an available space does not exist or is insufficient in the first memory area 1331, invalid data of the first memory area 1331 may be deleted according to the control of the memory controller 1310, as mentioned with reference to FIG. 5. In some example embodiments, when the total storage capacity of the first memory area 1331 is smaller than a reference value, the first memory device 1330 may not be used to store the data HD according to the control of the memory controller 1310, as mentioned with reference to FIG. 7.

Figure 11:
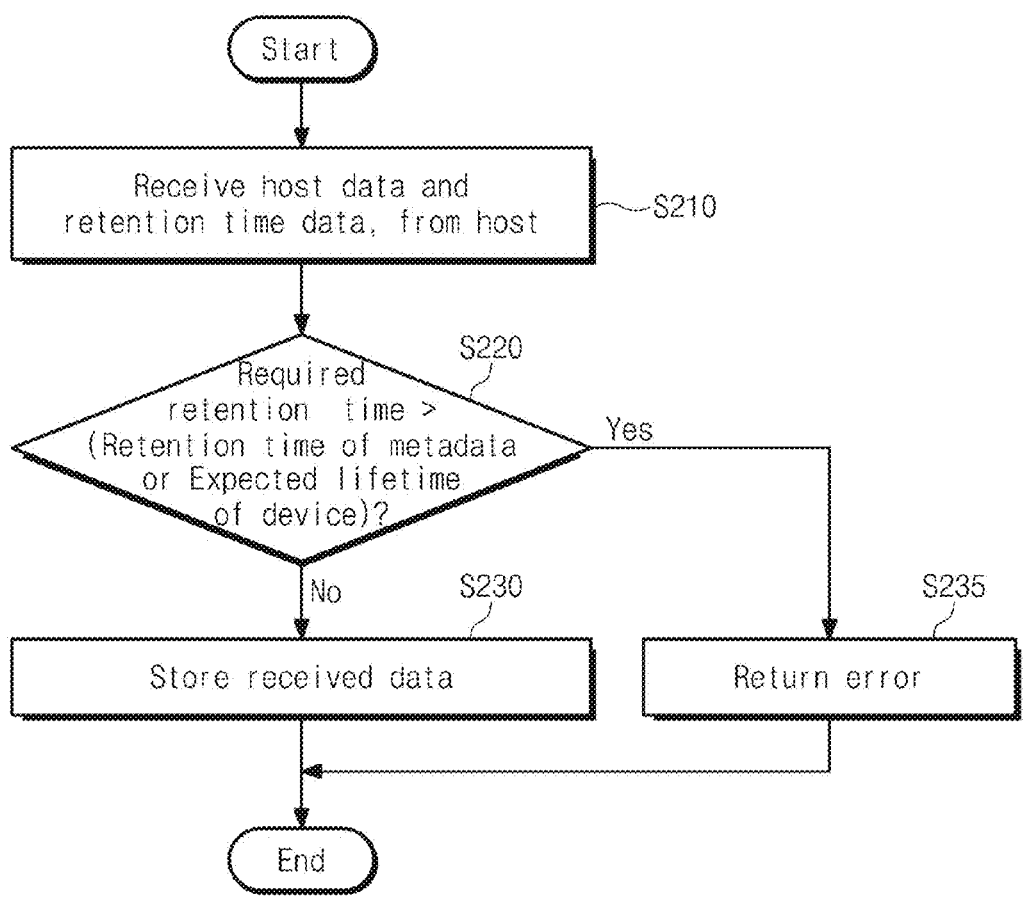
FIG. 11 is a flowchart describing a process of storing data in a storage device of FIG. 1 according to another example embodiment of the present disclosure.

FIG. 11 is a flowchart describing a process of storing data in a storage device of FIG. 1 according to another example embodiment of the present disclosure.

In operation S210, a storage device 1300 (see FIG. 1) may receive data HD (see FIG. 10) and retention time data RTD (see FIG. 10). The data HD and the retention time data RTD may be provided from a host 1100 (see FIG. 1). The description of the retention time data RTD has been mentioned with reference to FIG. 10.

In operation S220, according to a control of a memory controller 1310 (see FIG. 1), a determination may be made on whether proper retention time data RTD is provided. More specifically, according to the control of the memory controller 1310, a determination may be made on whether required retention time of the data HD is longer than retention time of metadata. Alternatively, according to the control of the memory controller 1310, a determination may be made on whether the required retention time of the data HD may be longer than expected remaining life of a memory device or the storage device 1300.

As mentioned above, since metadata includes information associated with data stored in a memory device or the storage device 1300, the data HD may not be read appropriately when the metadata is lost or damaged. Furthermore, when the required retention time of the data HD is longer than the expected remaining life of the memory device or the storage device 1300, it is difficult to reliably store the data HD until the required retention time is expired. Thus, the required retention time of the data HD needs not to be longer than the retention time of the metadata or the expected remaining life of the memory device or the storage device 1300. In order to implement this example embodiment, the retention time of the metadata or the expected remaining time of the memory device or the storage device 1300 needs to be managed.

When the proper retention time data RTD is provided, the method proceeds to operation 5230. On the other hand, when the proper retention time data RTD is not provided, the method proceeds to operation S235.

In operation 5230, the data HD received in operation S210 may be stored. As an example embodiment, the data HD may be stored in a memory area having the highest storage reliability level until the required retention time is expired. For instance, the retention time data RTD may be stored in the same memory area as the data HD or in a different memory area from the data HD. Alternatively, the retention time data RTD may be stored in a reliability data area 2335 (see FIG. 2) or a nonvolatile memory 2360 (see FIG. 2) together with storage reliability data. However, these examples are merely exemplary, and the present disclosure is not limited by these examples.

In operation S235, an error signal may be returned. For instance, when the required retention time of the data HD is longer than the retention time of metadata or the expected remaining life of the storage device 1300, the error signal may be returned to the host 1100, according to the control of the memory controller 1310. In some example embodiments, a user of the host 1100 who recognizes an error may input another required retention time having another value through a user interface. For another instance, when the required retention time of the data HD is longer than the expected remaining life of the memory device, an error signal may be returned to the memory controller 1310. In some example embodiments, the memory controller 1310 may search another memory device that satisfies the required retention time of the data HD (i.e., a memory device having an expected remaining life longer than the required retention time of the data HD) in response to the error signal. However, these examples and these example embodiments are merely provided to help understand the present disclosure, and are not intended to limit the present disclosure.

Figure 12:
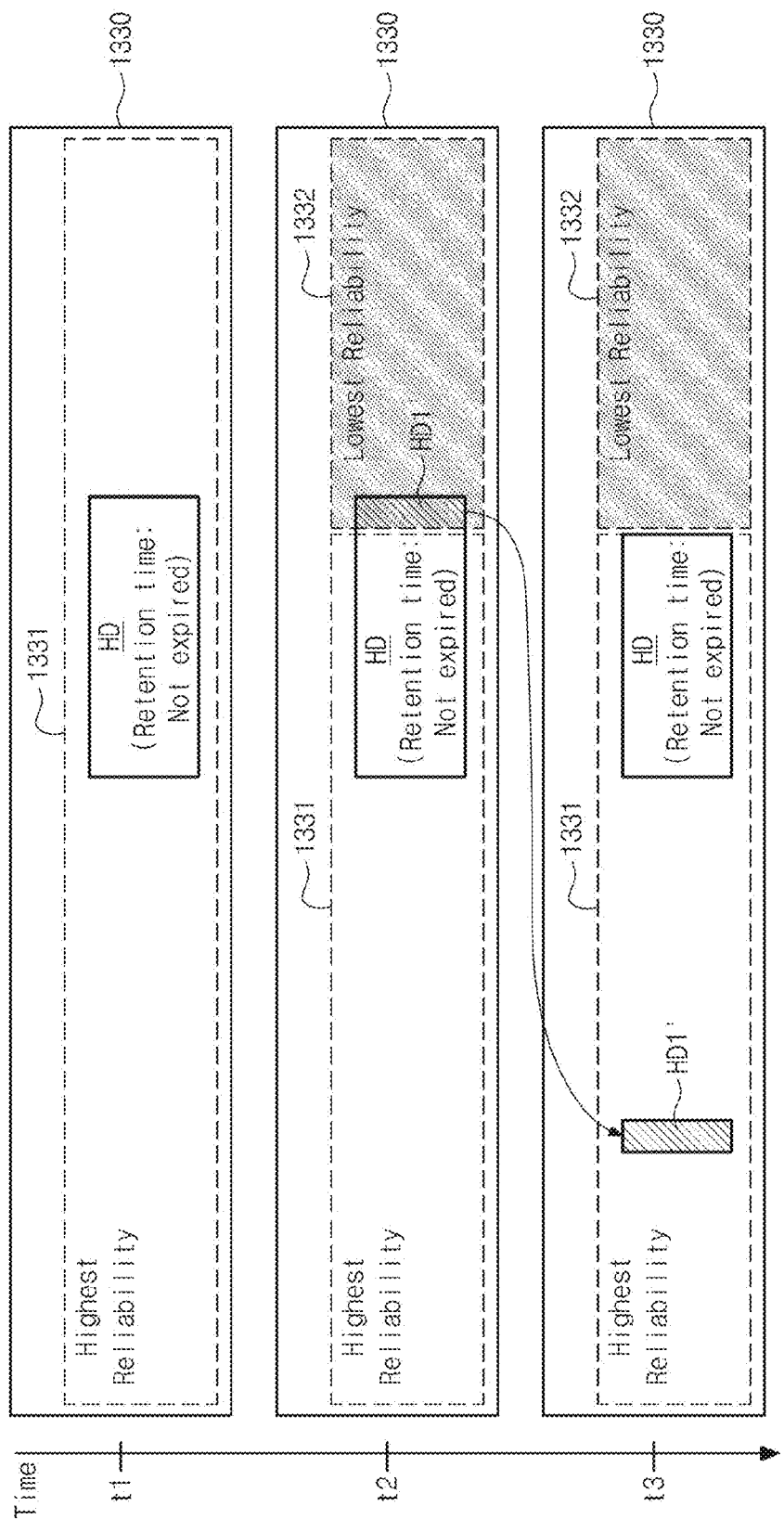
FIG. 12 is a conceptual diagram illustrating a process of managing data stored in a memory area of FIG. 1 according to another example embodiment of the present disclosure.

FIG. 12 is a conceptual diagram illustrating a process of managing data stored in a memory area of FIG. 1 according to another example embodiment of the present disclosure. For brevity of the description, it is illustrated in FIG. 12 that the storage device 1300 includes only a first memory device 1330 and two storage reliability levels are used. However, the present disclosure is not limited by the configuration shown in FIG. 12. The number of memory devices included in the storage device 1300, the number of memory areas included in a memory device, and the number of storage reliability levels may be variously changed or modified.

FIG. 12 illustrates a process of managing data HD depending on the lapse of time, from time "t1" to "t3". At time "t1", memory cells included in the first memory device 1330 are deteriorated little. Accordingly, the first memory device 1330 may include only a first memory area 1331 having the highest storage reliability level. The first memory area 1331 may store the data HD.

At time "t2", some of the memory cells included in the first memory device 1330 are deteriorated much. Accordingly, the first memory device 1330 may include not only the first memory area 1331 but also a second memory area 1332 having the lowest storage reliability level. For instance, as the second memory area 1332 is generated, a part HD1' of the data HD may belong to the second memory area 1332. When the data HD belongs to the second memory area 1332, it is difficult to reliably store the data HD.

At time "t3", as an example embodiment, the part HD1' of the data HD may be moved to the first memory area 1331 having the highest storage reliability level, according to a control of a memory controller 1310 (see FIG. 1). As a result, the data HD may be reliably stored. To sum up, when a storage reliability level of a memory area storing specific data is lowered before required retention time of the specific data is expired, the specific data may be moved to another memory area having the highest storage reliability level, according to the control of the memory controller 1310.

For instance, the process of moving the data HD may be performed immediately after the storage reliability level is changed. Alternatively, the process of moving the data HD may be performed periodically or at each of specific time points, or based on a specific condition. For instance, when a garbage collection operation is performed at the storage device 1300 or the first memory device 1330, the data HD may be moved. However, the above examples are merely provided to help understand the present disclosure, and are not intended to limit the present disclosure.

In FIG. 12, it is illustrated that the data HD is moved within the same memory device (e.g., the first memory device 1330). However, in some example embodiments, the data HD may be moved to another memory device.

Figure 13:
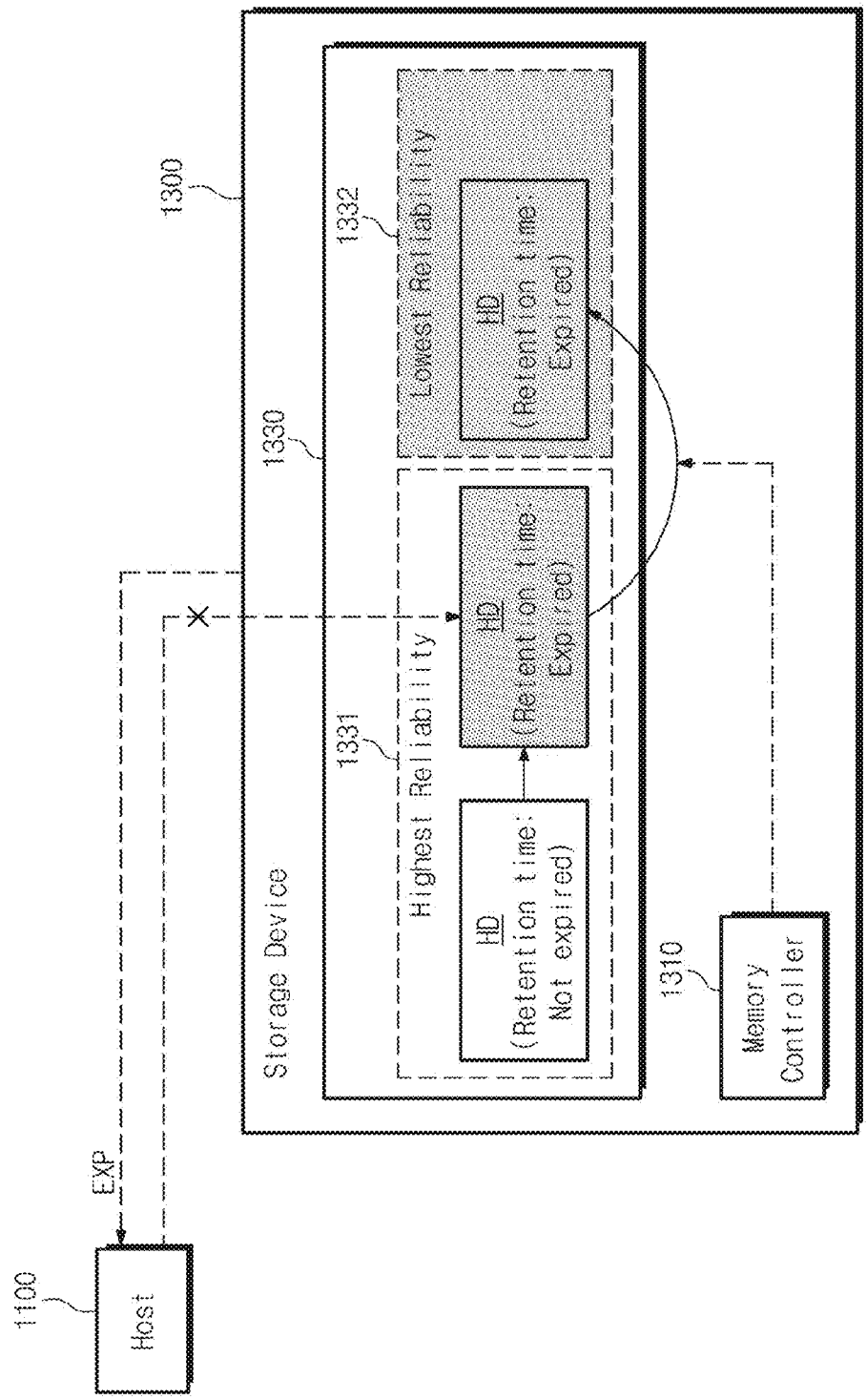
FIG. 13 is a conceptual diagram illustrating another process of managing data stored in a memory area of FIG. 1 according to another example embodiment of the present disclosure.

FIG. 13 is a conceptual diagram illustrating another process of managing data stored in a memory area of FIG. 1 according to another example embodiment of the present disclosure. For brevity of the description, it is illustrated in FIG. 13 that the storage device 1300 includes only a first memory device 1330 and the first memory device 1330 includes two memory areas 1331 and 1332. However, the present disclosure is not limited by the configuration shown in FIG. 13. The number of memory devices included in the storage device 1300 and the number of memory areas included in a memory device may be variously changed or modified.

With the lapse of time, a required retention time of data HD may be expired. In some example embodiments, when the required retention time of the data HD is expired, access to the data HD may be blocked, according to the control of a memory controller 1310. For instance, the required retention time of the data HD may correspond to time to provide storage service. In this instance, when the required retention time of the data HD is expired, the access to the data HD may be blocked to stop the storage service.

In some example embodiments, when the required retention time of the data HD is expired, expiration information EXP may be provided to the host 1100 according to the control of the memory controller 1310. The expiration information EXP is information for notifying expiration of the required retention time of the data HD. As an example embodiment, the expiration information EXP may be provided to the host 1100 when the required retention time of the data HD is expired. As another example embodiment, the expiration information EXP may be provided to the host 1100 when the host 1100 (e.g., a user of the host 1100) requests to access the data HD. However, these example embodiments are not intended to limit the present disclosure. Providing the expiration information EXP may be variously changed or modified.

In some example embodiments, although the required retention time of the data HD is expired, the data HD may be stored in the first memory area 1331 having the highest storage reliability level before the expiration information EXP is provided to the host 1100. After the expiration information EXP is provided to the host 1100, the data HD may be further managed according to the judgment of a user of the host 1100 or the management policy of the host 1100.

In some other example embodiments, when the required retention time of the data HD is expired, the data HD may be moved to a memory area that does not have the highest storage reliability, according to the control of the memory controller 1310. When the required retention time of the data HD is expired, it may be fine for the data HD not to be reliably stored. For instance, when the required retention time of the data HD is expired, the data HD may be moved to the second memory area 1332 having the lowest storage reliability level. According to this example embodiment, an available space of a memory area having the highest storage reliability level (e.g., the first memory area 1331) may be secured. However, this example embodiment is not intended to limit the present disclosure. The management and movement of the data HD having the expired required retention time may be variously changed or modified.

Unlike the above example embodiments, when the required retention time of the data HD is expired, the data HD may be immediately deleted from the storage device 1300, according to the control of the memory controller 1310. However, when the data HD is immediately deleted, a request for continuously storing the data HD may not be supported. If the data HD is stored in the storage device 1300 for a specific time period even though the required retention time of the data HD is expired, the request for continuously storing the data HD (e.g., a request for updating the required retention time of the data HD) may be supported, as will be mentioned with reference to FIG. 14. The specific time period, for storing the data HD in the storage device 1300 after the required retention time of the data HD is expired, may be differently selected or changed according to the embodiment.

Figure 14:
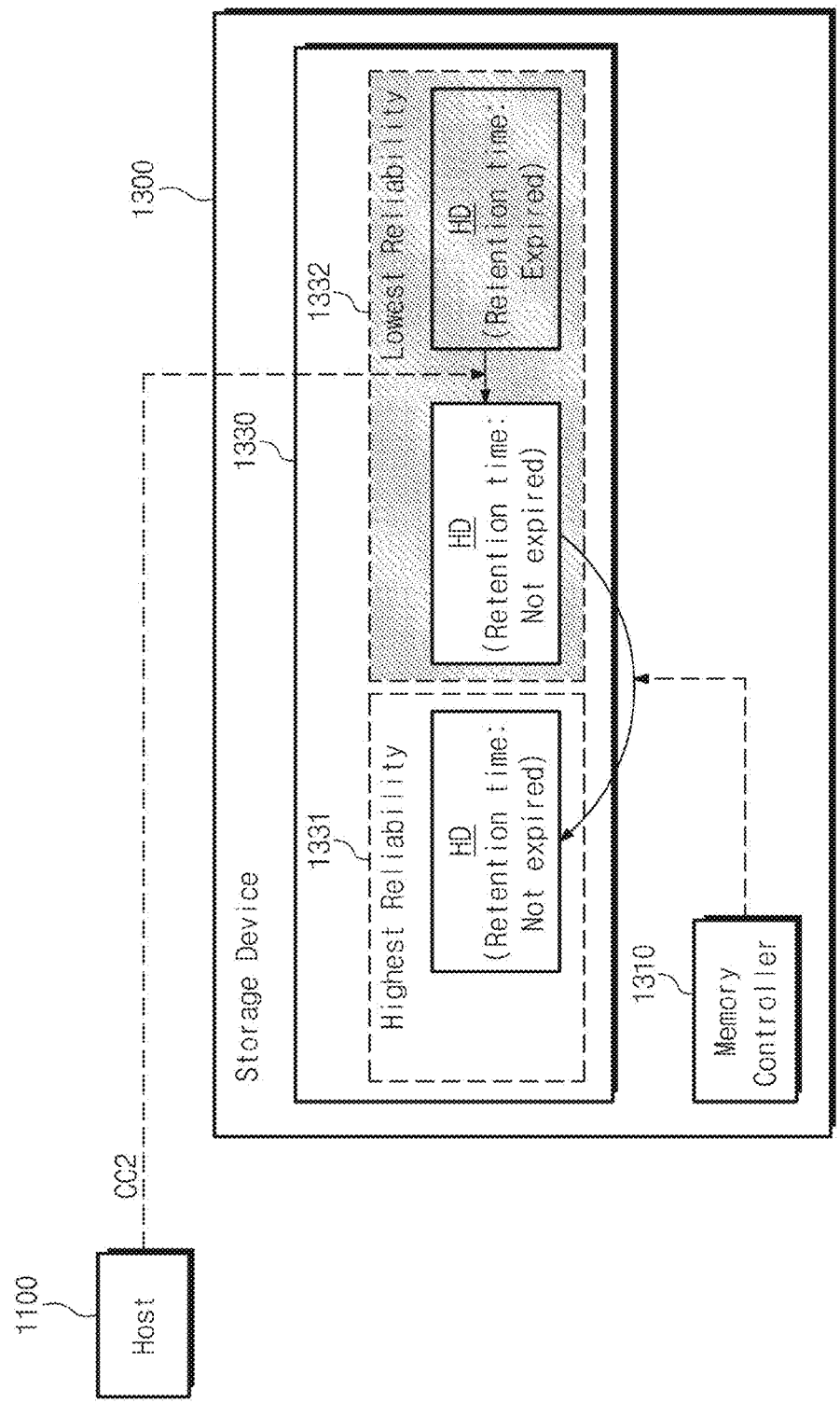
FIG. 14 is a conceptual diagram illustrating still another process of managing data stored in a memory area of FIG. 1 according to another example embodiment of the present disclosure.

FIG. 14 is a conceptual diagram illustrating still another process of managing data stored in a memory area of FIG. 1 according to another example embodiment of the present disclosure. For brevity of the description, it is illustrated in FIG. 14 that the storage device 1300 includes only a first memory device 1330 and the first memory device 1330 includes two memory areas 1331 and 1332. However, the present disclosure is not limited by the configuration shown in FIG. 14. The number of memory devices included in the storage device 1300 and the number of memory areas included in a memory device may be variously changed or modified.

In an example embodiment, a host 1100 may provide a change command CC2 to the storage device 1300. The change command CC2 is used to change a required retention time of data HD. When the change command CC2 is provided from the host 1100, a value of the required retention time of the data HD, that is a target of change, may be changed in response to the change command CC2. For instance, the required retention time of the data HD may be extended or shortened by changing the required retention time of the data HD. Alternatively, although the required retention time of the data HD is expired, the required retention time of the data HD may be updated. In this example embodiment, the host 1100 may include a user interface used to change the required retention time of the data HD.

For instance, the data HD having the expired required retention time may have been stored in the first memory device 1330. In particular, according to the example embodiment mentioned with reference to FIG. 13, the data HD having the expired required retention time may be stored in the second memory area 1332 having the lowest storage reliability level. The host 1100 (e.g., a user of the host 1100) may provide the change command CC2 for updating the required retention time of the data HD to the storage device 1300. The required retention time of the data HD may be updated in response to the change command CC2.

As an example embodiment, when the required retention time of the data HD is updated, the data HD may be moved to a memory area having the highest storage reliability level (e.g., the first memory area 1331), according to the control of the memory controller 1310. Thus, the data HD may be reliably stored.

For instance, the process of moving the data HD may be performed immediately after the required retention time is changed. Alternatively, the process of moving the data HD may be performed periodically or at each of specific times, or based on a specific condition. For instance, the data HD may be moved when a garbage collection operation is performed at the storage device 1300 or the first memory device 1330. However, the above examples are merely provided to help understand the present disclosure and are not intended to limit the present disclosure.

In FIG. 14, it is illustrated that the data HD is moved within the same memory device (e.g., the first memory device 1330). However, in some example embodiments, the data HD may be moved to another memory device. FIG. 14 is merely an example to help understand the present disclosure.

Figure 15:
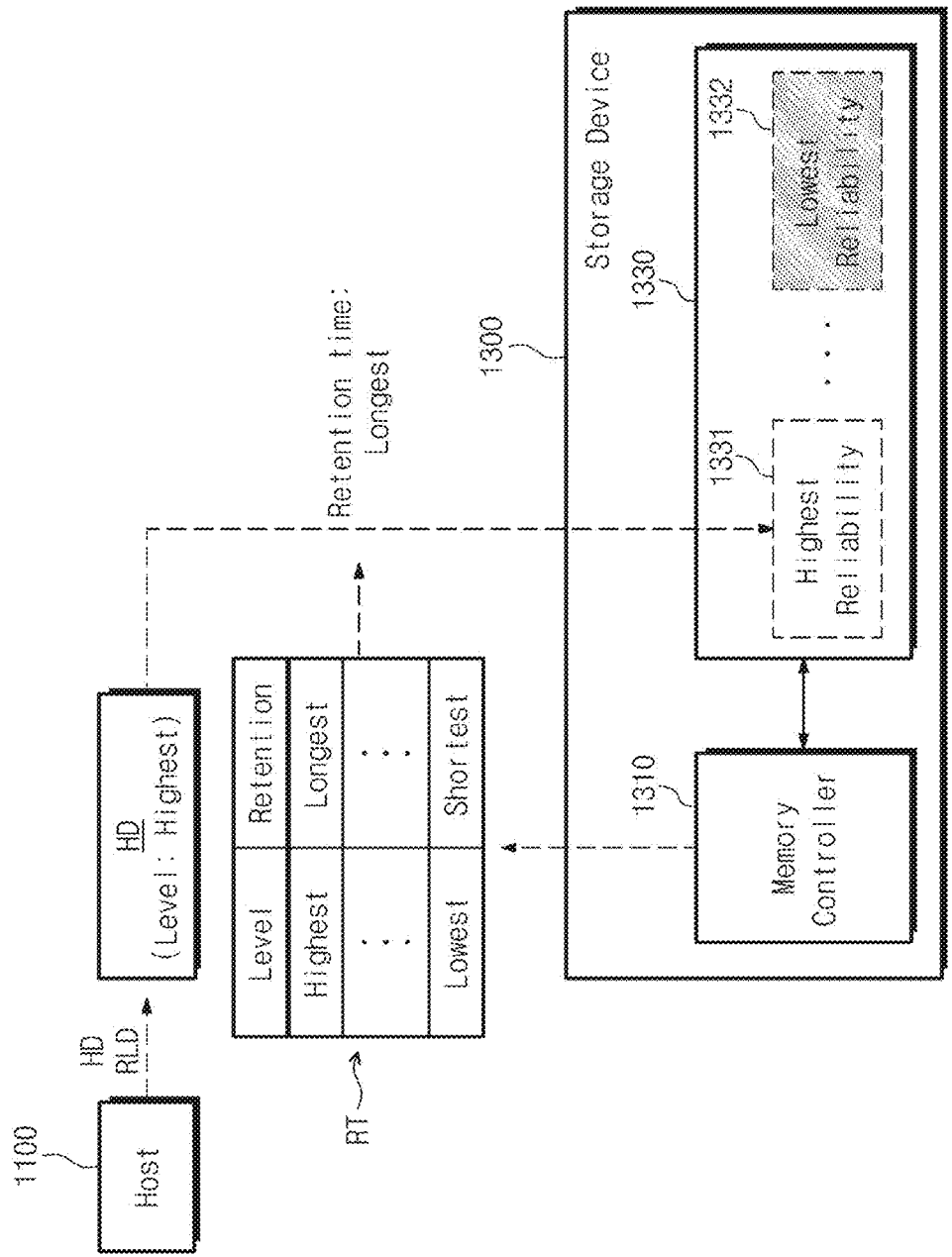
FIG. 15 is a conceptual diagram illustrating a process of storing data in a storage device of FIG. 1 according to still another example embodiment of the present disclosure.

FIG. 15 is a conceptual diagram illustrating a process of storing data in a storage device of FIG. 1 according to still another example embodiment of the present disclosure. For brevity of the description, it is illustrated in FIG. 15 that the storage device 1300 includes only a first memory device 1330. However, the present disclosure is not limited by the configuration shown in FIG. 15. The number of memory devices included in the storage device 1300 may be variously changed or modified.

A host 110 may provide data HD to the storage device 1300. In an example embodiment, the host 1100 may further provide required level data RLD to the storage device 1300. As mentioned above, the required level data RLD may include information associated with a required reliability level of the data HD. As an example embodiment, retention time corresponding to the required reliability level of the data HD may be selected according to the control of a memory controller 1310. The retention time of the data HD indicates time for which the data HD is to be retained.

In an example embodiment, a longer retention time may be selected as the required reliability level of the data HD is higher. The data HD having a higher required reliability level may be retained longer. On the other hand, a relatively shorter retention time may be selected as the required reliability level of the data HD is lower. The data HD having a lower required reliability level may be retained relatively shorter. As the required reliability level of the data HD is higher, the retention time may be selected to have a longer value according to the control of the memory controller 1310.

In some example embodiments, the memory controller 1310 may refer to a relationship table RT to select retention time. The relationship table RT may include information associated with a correspondence relationship between the required reliability level and the retention time of the data HD. The information included in the relationship table RT may be stored in a memory area of the storage device 1300 or a nonvolatile memory 2360 (see FIG. 2), but the present disclosure is not limited thereto.

For instance, the highest required reliability level of the data HD may correspond to a retention time of ten years, and the lowest required reliability level of the data HD may correspond to a retention time of one year. In this instance, data HD having the highest required reliability level may be stored for ten years, and data HD having the lowest required reliability level may be stored for one year. However, this example embodiment is merely provided to help understand the present disclosure, and is not intended to limit the present disclosure.

For instance, in FIG. 15, the data HD having the highest required reliability level may be provided from the host 1100. According to the control of the memory controller 1310, a retention time corresponding to the highest required reliability level (e.g., ten years) may be selected referring to the relationship table RT. According to the control of the memory controller 1310, the data HD may be stored in the storage device 1300 for the retention time (e.g., ten years).

The data HD, the required level data RLD, and the retention time data including information associated with retention time may be stored in some or all of a plurality of memory areas included in the storage device 1300. The memory controller 1310 may control memory devices to store the data HD, the required level data RLD, and the retention time data in some or all of the memory areas. For instance, the data HD, the required level data RLD, and the retention time data may be stored in the first memory device 1330. However, this example is merely provided to help understand the present disclosure. The data HD, the required level data RLD, and the retention time data may be stored in another memory device included in the storage device 1300.

As an example embodiment of the present disclosure, the data HD may be stored in the first memory area 1331 having the highest storage reliability level according to the control of the memory controller 1310. Since the retention time indicates time required to retain the data HD, the data HD needs to be reliably stored before the retention time is expired. Thus, the data HD may be stored in the first memory area 1331 before the retention time is expired, according to the control of the memory controller 1310.

In some example embodiments, when an available space does not exist or is insufficient in the first memory area 1331, the data HD may be stored not in the first memory device 1330 but in another memory device, according to the control of the memory controller 1310, as mentioned with reference to FIG. 4. In some example embodiments, when an available space does not exist or is insufficient in the first memory area 1331, invalid data of the first memory area 1331 may be deleted, according to the control of the memory controller 1310, as mentioned with reference to FIG. 5. In some example embodiments, when the total storage capacity of the first memory area 1331 is smaller than a reference value, the first memory device 1330 may not be used to store the data HD, according to the control of the memory controller 1310, as mentioned with reference to FIG. 7.

In some example embodiments, when a storage reliability level of a memory area storing the data HD is lowered before the retention time of the data HD is expired, the data HD may be moved to another memory area having the highest storage reliability level, according to the control of the memory controller 1310, as mentioned with reference to FIG. 12. In some example embodiments, when the retention time of the data HD is changed by changing a required reliability level of the data HD, the data HD may be moved to another memory area, according to the control of the memory controller 1310, as mentioned with reference to FIGS. 13 and 14.

In some example embodiments, when the retention time of the data HD is expired, the data HD may be deleted from the storage device 1300. In some other example embodiments, when the retention time of the data HD is expired, the data HD may be moved to a memory area having the lowest storage reliability level. These example embodiments have been mentioned with reference to FIG. 13.

FIGS. 16 and 17 are conceptual diagrams for describing exemplary effects obtained by using a storage device according to an example embodiment of the present disclosure. For example, referring to FIGS. 16 and 17, descriptions will be made as to the case where three-dimensional image data is stored as data in a storage device. However, this example is merely provided to help understand the present disclosure, and is not intended to limit the present disclosure. The present disclosure may be applied to store various types of data.

Three-dimensional image data includes vertex data and polygon data used to express an object. The more the amount of vertex data and polygon data included in the three-dimensional image data is, the more the object is precisely expressed. The three-dimensional image data may include data used to express a general structure of an object and data used to express a detailed structure of the object.

The data used to express the general structure of the object is essentially required to express the object. On the other hand, the data used to express the detailed structure of the object is required to realistically express the object, but is not essentially required. Thus, the data used to express the general structure of the object may have a "higher required reliability level", or "longer required retention time" or "longer retention time", than the data used to express the detailed structure of the object.

For instance, in FIG. 16, it is assumed that first data HD1 is used to express a general structure of an object, second data HD2 is used to express the object in more detail than the first data HD1, and third data HD3 is used to express the object in more detail than the second data HD2. As an example embodiment, the first data HD1 may have the highest required reliability level, the third data HD32 may have the lowest required reliability level, and the second data HD2 may have an intermediate required reliability level. As another example embodiment, the first data HD1 may have the longest required retention time T3, the third data HD3 may have the shortest required retention time T1, and the second data HD2 may have intermediate required retention time T2. As still another example embodiment, the first data HD1 may have the longest retention time T3, the third data HD3 may have the shortest retention time T1, and the second data HD2 may have intermediate retention time T2.

According to the example embodiments of the present disclosure, the first data HD1 may be stored in a memory area having the highest storage reliability level. Alternatively, the required retention time or retention time of the first data HD1 may be expired lastly. The first data HD1 may be stored most reliably. On the other hand, the third data HD3 may be stored in a memory area having the lowest storage reliability level. Alternatively, required retention time or retention time of the third data HD3 may be expired first. The third data HD3 may be stored relatively less reliably.

For instance, in FIG. 17, the first data HD1, the second data HD2, and the third data HD3 may be usable until the retention time T1 of the third data HD3 is expired. Thus, a three-dimensional image having high image quality may be expressed until the retention time T1 of the third data HD3 is expired. For instance, after the retention time T1 of the third data HD3 is expired, the third data HD3 may be lost or damaged due to deterioration of a memory area having the lowest storage reliability level. Alternatively, after the retention time T1 of the third data HD3 is expired, access to the third data HD3 may be blocked.

The first data HD1 and the second data HD2 may be usable until the retention time T2 of the second data HD2 is expired after the retention time T1 of the third data HD3 is expired. A three-dimensional image having intermediate quality may be expressed until the retention time T2 of the second data HD2 is expired. For instance, the second data HD2 may be lost or damaged, or access to the second data HD2 may be blocked, after the retention time T2 of the second data HD2 is expired.

Only the first data HD1 may be usable until the retention time T3 of the first data HD1 is expired after the retention time T2 of the second data HD2 is expired. A general structure of a three-dimensional image may be expressed based on the first data HD1.

Unlike the example embodiments of the present disclosure, when the first data HD1, the second data HD2, and the third data HD3 are all stored without consideration of a reliability level or retention time, they may become unusable at the same time. On the other hand, according to the example in FIGS. 16 and 17, even though the image quality of a three-dimensional image is slightly degraded with the lapse of time, the three-dimensional image may be expressed for a longer period of time.

As can be understood from the example in FIGS. 16 and 17, according to the example embodiments of the present disclosure, data having a high required reliability level or long retention time may continue to be usable although data having a low required reliability level or short retention time is unusable. For instance, although less important data is lost or damaged as a storage reliability level of a storage device or a memory device is lowered, more important data may be still retained. According to the example embodiments of the present disclosure, the data having a high required reliability level or long required retention time may be reliably stored for a long period of time. Thus, according to the example embodiments of the present disclosure, time for which a storage device or a storage system can be used may be extended. As a result, according to the example embodiments of the present disclosure, the cost consumed to maintain and manage data may be reduced.

Figure 18:
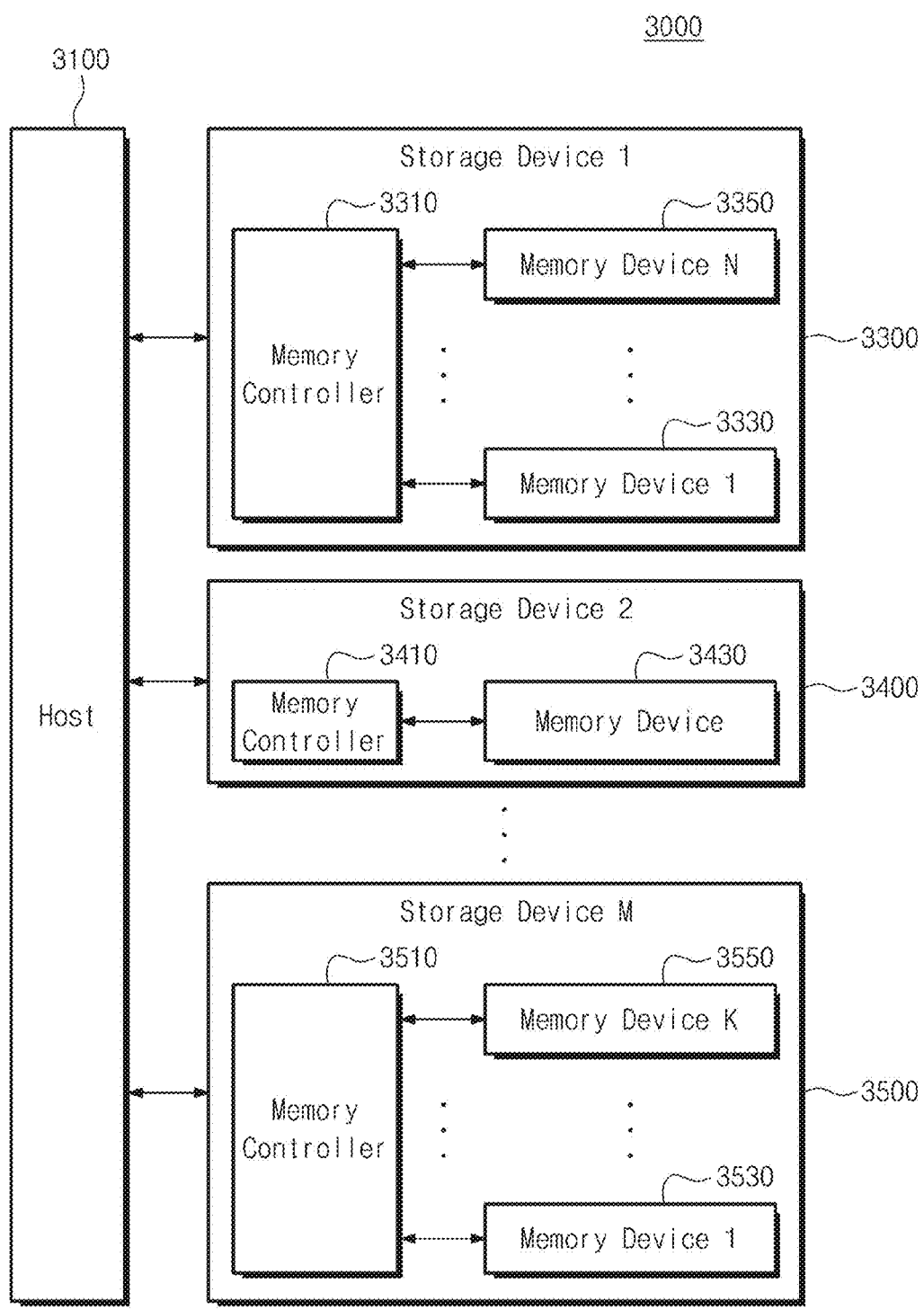
FIG. 18 is a block diagram illustrating an electronic system including a storage system according to an example embodiment of the present disclosure.

FIG. 18 is a block diagram illustrating an electronic system including a storage system according to an example embodiment of the present disclosure. An electronic system 3000 may include a host 3100 and a storage system. The storage system may include one or more storage devices 3300, 3400, and 3500.

The first storage device 3300 may include a memory controller 3310 and a plurality of memory devices 3330 and 3350. The second storage device 3400 may include a memory controller 3410 and a memory device 3430. The third storage device 3500 may include a memory controller 3510 and a plurality of memory devices 3530 and 3550. In FIG. 18, it is illustrated that the storage system includes three storage devices 3300, 3400, and 3500, but the present disclosure is not limited thereto. The number of storage devices included in the storage system may be variously changed or modified. Furthermore, the number of memory devices included in each storage device may be variously changed or modified. The configuration shown in FIG. 18 is merely an example to help understand the present disclosure.

The host 3100 and the storage devices 3300, 3400, and 3500 shown in FIG. 18 may be configured and may operate according to the example embodiments mentioned with reference to FIGS. 1 to 15. Each of the memory devices may include at least one of a plurality of memory areas that are configured to have different reliability levels from one another. According to the control of the memory controllers 3310, 3410, and 3510, each of the storage devices 3300, 3400, and 3500 may store data based on at least one of a required reliability level, required retention time, and retention time of the data. Redundant descriptions associated with the example embodiments of the present disclosure will be omitted below for brevity of the description.

For instance, when the electronic system 3000 is a single system including both the host 3100 and the storage system, the storage devices 3300, 3400, and 3500 included in the storage system may be local storage devices. For instance, when the host 3100 and the storage system are separately implemented from each other, the storage devices 3300, 3400, and 3500 included in the storage system may operate as a remote storage server and the host 3100 may operate as a client that accesses the storage system. For instance, the storage devices 3300, 3400, and 3500 operating as a storage server may constitute a redundant array of inexpensive disks (RAID) system. For instance, a plurality of hosts 3100 may be provided to access the storage system including the storage devices 3300, 3400, and 3500. However, these examples are not intended to limit the present disclosure. The storage system may be implemented in various forms different from these examples.

Figure 19:
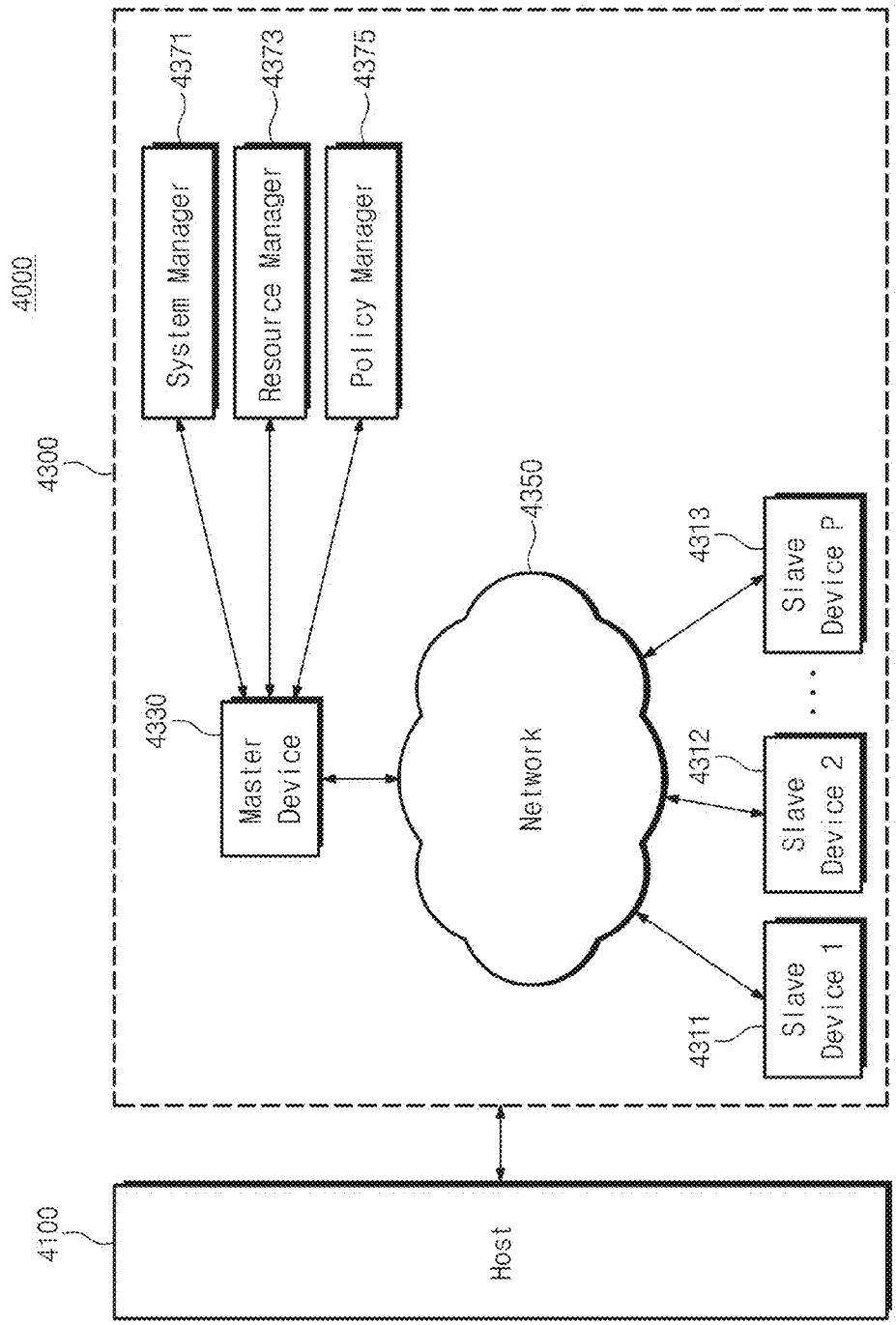
FIG. 19 is a block diagram illustrating an electronic system including a distributed cloud storage system according to an example embodiment of the present disclosure.

FIG. 19 is a block diagram illustrating an electronic system including a distributed cloud storage system according to an example embodiment of the present disclosure. An electronic system 4000 may include a host 4100 and a distrusted cloud storage system 4300.

The host 4100 may communicate with the distributed cloud storage system 4300 based on at least one of various communication protocols. The distributed cloud storage system 4300 may store data in compliance with a distributed file system. The distributed cloud storage system 4300 may store data received from the host 4100, or may provide stored data to the host 4100. At least one host 4100 may access the distributed cloud storage system 4300.

The distributed cloud storage system 4300 may include a plurality of slave devices 4311, 4312, and 4313, that are configured to store data. Each of the slave devices 4311, 4312, and 4313 may operate as a "data node" of the distributed file system.

Each of the slave devices 4311, 4312, and 4313 may be configured and may operate according to the example embodiments mentioned with reference to FIGS. 1 to 15. Each of memory devices included in the slave devices 4311, 4312, and 4313 may include at least one of a plurality of memory areas that is configured to have different storage reliability levels from one another. Each of the slave devices 4311, 4312, and 4313 may store data based on at least one of a required reliability level, required retention time, and retention time of the data. Redundant descriptions associated with the example embodiments of the present disclosure will be omitted below for brevity of the description.

The distributed cloud storage system 4300 may include a master device 4330 that is configured to control the slave devices 4311, 4312, and 4313 and manage information associated with stored data. The master device 4330 may operate as a "name node" of the distributed file system. The master device 4330 may communicate with the slave devices 4311, 4312, and 4313 via a network 4350. For instance, the network 4350 may include at least one of a personal area network (PAN), a metropolitan area network (MAN), a local area network (LAN), a wide area network (WAN), and Internet, but the present disclosure is not limited by these examples.

For instance, the distributed cloud storage system 4300 may include a system manager 4371, a resource manager 4373, and a policy manager 4375. The system manager 4371 may control and manage the overall operations of the distributed cloud storage system 4300. The resource manager 4373 may manage resource usage of components included in the distributed cloud storage system 4300. The policy manager 4375 may manage a policy associated with access to the distributed cloud storage system 4300 by the host 4100, and may control the access by the host 4100. However, this example is not intended to limit the present disclosure. The distributed cloud storage system 4300 may further include other components that are not shown in FIG. 19. Alternatively, the distributed cloud storage system 4300 may not include at least one of the components shown in FIG. 19.

Each of the slave devices 4311, 4312, and 4313 and the master device 4330 may be a computing device, such as a personal computer and a workstation. The system manager 4371, the resource manager 4373, and the policy manager 4375 may be provided separately from the master device 4330, or may be included in the master device 4330. The configuration shown in FIG. 19 is not intended to limit the present disclosure. The distributed cloud storage system 4300 may be implemented in various forms different from that shown in FIG. 19.

Figure 20:
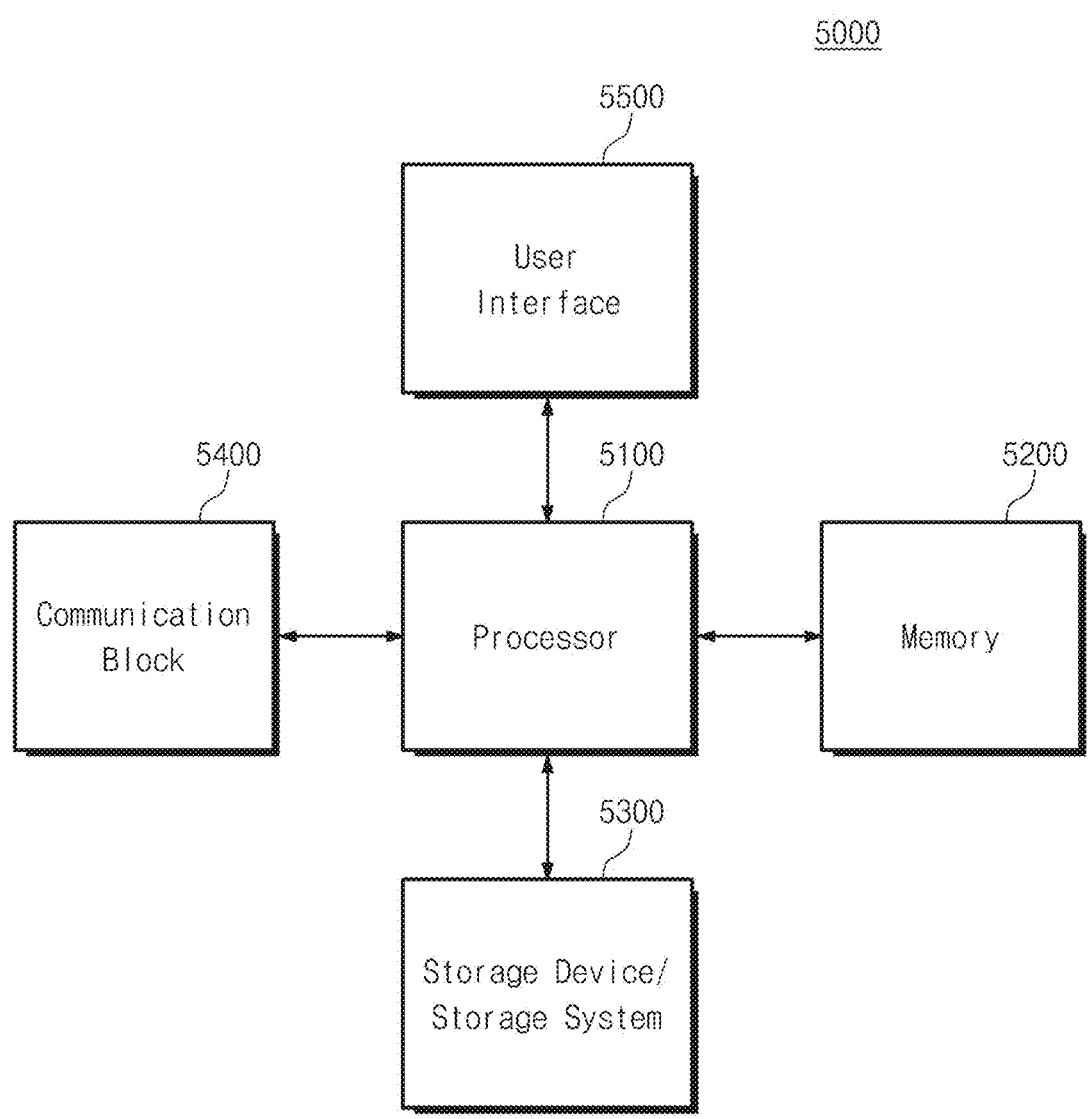
FIG. 20 is a block diagram illustrating an electronic device including a storage device or a storage system according to an example embodiment of the present disclosure.

FIG. 20 is a block diagram illustrating an electronic device including a storage device or a storage system according to an example embodiment of the present disclosure. An electronic device 5000 may include a processor 5100, a memory 5200, a storage device/storage system 5300, a communication block 5400, and a user interface 5500. The electronic device 5000 may be a personal computer (PC), a peripheral device, a digital camera, a personal digital assistant (PDA), a portable multimedia player (PMP), a smartphone, a tablet computer, a wearable device or the like.

The processor 5100 may control the overall operations of the electronic device 5000. For instance, the processor 5100 may include an application processor. Alternatively, the processor 5100 may include a general-purposed processor or a workstation processor.

The memory 5200 may temporarily store data used to operate the electronic device 5000. The memory 5200 may be used as a working memory, an operation memory, a buffer memory or the like of the electronic device 5000. In some example embodiments, the memory 5200 may include a volatile memory such as a static RAM (SRAM), a dynamic RAM (DRAM), and a synchronous DRAM (SDRAM), or a nonvolatile memory such as a flash memory, a PRAM, an MRAM, a ReRAM, and an FRAM. The memory 5200 may include at least one memory module or at least one memory package.

The storage device/storage system 5300 may store data that needs to be retained. The storage device/storage system 5300 may be a local or external storage device or a remote storage system.

The storage device/storage system 5300 may be configured and may operate according to the example embodiments mentioned with reference to FIGS. 1 to 15. Each of memory devices included in the storage device/storage system 5300 may include at least one of a plurality of memory areas that is configured to have different storage reliability levels from one another. The storage device/storage system 5300 may store data based on at least one of a required reliability level, required retention time, and retention time of the data. Redundant descriptions associated with the example embodiments of the present disclosure will be omitted below for brevity of the description.

The communication block 5400 may communicate with an external entity of the electronic device 5000 according to the control of the processor 5100. The communication block 5400 may communicate with an external entity of the electronic device 5000 according to a wired or wireless communication protocol. For instance, the communication block 5400 may communicate with an external entity of the electronic device 5000 according to at least one of various wireless communication protocols such as LTE, WiMax, GSM, CDMA, HSPA, Bluetooth, NFC, WiFi, and RFID and various wired communication protocols such as USB, SCSI, PCIe, ATA, PATA, SATA, SAS, IDE, Firewire, and UFS.

The user interface 5500 may arbitrate communication between a user and the electronic device 5000 according to the control of the processor 5100. For instance, the user interface 5500 may include an input interface such as a keyboard, a keypad, a button, a touch panel, a touch screen, a touch ball, a touch pad, a camera, a microphone, a gyroscope sensor, and a vibration sensor. The user interface device 5500 may include an output interface such as a liquid crystal display (LCD), a light emitting diode (LED) display, an organic LED (OLED) display, an active matrix OLED (AMOLED) display, a speaker, and a motor.

The user interface 5500 may be configured and may operate according to the example embodiments mentioned with reference to FIGS. 1 to 15. The user interface 5500 may be used to input a required reliability level or required retention time of data.

However, FIG. 20 is not intended to limit the present disclosure. The electronic device 5000 may further include other components that are not shown in FIG. 20. Alternatively, the electronic device 5000 may not include at least one of the components shown in FIG. 20.

Processors, memory devices, controllers, and other electronic circuits according to the example embodiments of the present disclosure may be mounted in various types of packages. For instance, processors, memory devices, controllers, and other electronic circuits according to the example embodiments of the present disclosure may be packaged by one or more of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

A configuration illustrated in each conceptual diagram should be understood just from a conceptual point of view. Shape, structure, and size of each component illustrated in each conceptual diagram are exaggerated or downsized for understanding of the present disclosure. An actually implemented configuration may have a physical shape different from a configuration of each conceptual diagram. The present disclosure is not limited to a physical shape or size illustrated in each conceptual diagram.

The device configuration illustrated in each block diagram is provided to help understand of the present disclosure. Each block may include smaller blocks according to functions. Alternatively, a plurality of blocks may form a larger block according to a function. That is, the present disclosure is not limited to the components illustrated in each block diagram.

While the present disclosure has been particularly shown and described with reference to example embodiments thereof, the present disclosure is not limited to the above-described example embodiments. It will be understood by those of ordinary skill in the art that various changes and variations in form and details may be made therein without departing from the spirit and scope of the present disclosure as defined by the following claims.

What is claimed is:

1. A storage device configured to communicate with a host, the storage device comprising:
a plurality of memory devices, each of the plurality of memory devices comprising at least one of a plurality of memory areas, the plurality of memory areas having different storage reliability levels; and
a memory controller configured to control the plurality of memory devices such that data and required level data associated with a required reliability level of the data are stored in some or all of the plurality of memory areas, the data and the required level data being provided from the host, wherein
the data is stored in a memory area, among the plurality of memory areas, having a storage reliability level corresponding to the required reliability level, according to a control of the memory controller.

2. The storage device as set forth in claim 1, wherein the storage reliability levels are determined based on at least one of a result of error detection and correction operations performed in the plurality of memory areas and wear levels of the plurality of memory areas.

3. The storage device as set forth in claim 1, wherein storage reliability data associated with the storage reliability levels is stored in a memory area that is included in the plurality of memory devices and does not store the data and the required level data, or is stored in a nonvolatile memory provided separately from the plurality of memory devices.

4. The storage device as set forth in claim 1, wherein the required reliability level of the data is set by a user of the host based on an importance of the data, or is selected based on a management policy of the host with respect to the data.

5. The storage device as set forth in claim 1, wherein as the required reliability level of the data is higher, the data is stored in a memory area, among the plurality of memory areas, having a higher storage reliability level.

6. The storage device as set forth in claim 1, wherein when an available space does not exist or is insufficient in a memory area that is included in a first memory device from among the plurality of memory devices and has the storage reliability level corresponding to the required reliability level of the data, the data is stored in a memory area that is included in a second memory device other than the first memory device from among the plurality of memory devices and has the storage reliability level corresponding to the required reliability level of the data, according to the control of the memory controller.

7. The storage device as set forth in claim 1, wherein when an available space does not exist or is insufficient in a memory area having the storage reliability level corresponding to the required reliability level of the data, invalid data of the memory area having the storage reliability level corresponding to the required reliability level of the data is deleted, according to the control of the memory controller.

8. The storage device as set forth in claim 1, wherein when a total storage capacity of a memory area, that has a highest storage reliability level from among the plurality of memory areas included in a target memory device of the plurality of memory devices, is smaller than a reference value, the target memory device is not used to store the data, according to the control of the memory controller.

9. The storage device as set forth in claim 1, wherein:
error detection and correction operations are performed on the stored data according to the control of the memory controller, and
as the required reliability level of the stored data is higher, the error detection and correction operations are performed more precisely.

10. The storage device as set forth in claim 1, wherein the storage reliability levels are updated according to the control of the memory controller when a read operation or an erase operation is performed on the stored data.

11. The storage device as set forth in claim 1, wherein when the storage reliability level of the memory area storing the data is changed into another storage reliability level, the stored data is moved to another memory area having the storage reliability level corresponding to the required reliability level of the stored data, according to the control of the memory controller.

12. The storage device as set forth in claim 1, wherein:
the required reliability level of the stored data is changed into another required reliability level in response to a change command provided from the host, and
when the change command is provided, the required level data is changed into new required level data associated with the other required reliability level, according to the control of the memory controller.

13. The storage device as set forth in claim 12, wherein when a garbage collection operation is performed such that invalid data stored in the plurality of memory devices is deleted, the stored data having the other required reliability level is moved to a memory area having still another storage reliability level corresponding to the other required reliability level from among the plurality of memory areas.

14. A storage device configured to communicate with a host, the storage device comprising:
a plurality of memory devices, each of the plurality of memory devices comprising at least one of a plurality of memory areas, the plurality of memory areas having different storage reliability levels; and
a memory controller configured to control the plurality of memory devices such that data and retention time data associated with required retention time of the data are stored in some or all of the plurality of memory areas, the data and the retention time data being provided from the host, wherein
the data is stored in a target memory area having a highest storage reliability level from among the plurality of memory areas until the required retention time of the data is expired, according to a control of the memory controller.

15. The storage device as set forth in claim 14, wherein when the required retention time of the stored data is expired, access to the stored data is blocked, according to the control of the memory controller.

16. A storage device comprising:
a memory having data storage locations; and
a memory controller that maintains, for each of the data storage locations, an association between the data storage location and an expected reliability of retrieving data from the data storage location or between the data storage location and an expected remaining utility lifespan of the data storage location, wherein
the memory controller stores data received from a host in one of the data storage locations whose expected reliability or expected remaining utility lifespan corresponds to storage information, associated with the received data, received from the host.

17. The storage device of claim 16, wherein the storage information identifies a required level of reliability for a data storage location that will store the received data or an amount of time for retaining the received data in the storage device.

18. The storage device of claim 16, wherein:
the memory controller moves first data stored in a first of the data storage locations to a second of the data storage locations in response to detecting that first storage information associated with the first data corresponds neither to the expected reliability of the first data storage location nor the expected remaining utility lifespan of the first data storage location, but does correspond either to the expected reliability of the second data storage location or the expected remaining utility lifespan of the second data storage location, and
the first storage information identifies a required level of reliability for a data storage location storing the first data or an amount of time for retaining the first data in the storage device.

19. The storage device of claim 18, wherein:
the memory controller detects that the first storage information, upon its revision, corresponds neither to the expected reliability of the first data storage location nor the expected remaining utility lifespan of the first data storage location, in response to receiving an instruction from the host to revise the first storage information with second storage information associated with the first data, and the second storage information identifies a revised required level of reliability for a data storage location storing the first data or a revised amount of time for retaining the first data in the storage device.

20. The storage device as set forth in claim 1, wherein the required reliability level of the data indicates how reliably the data is to be stored in response to a user setting from the host or a determination of the host.

* * * * *